(12) United States Patent
Chen et al.

(10) Patent No.: US 11,681,234 B2
(45) Date of Patent: Jun. 20, 2023

(54) MASK FOR ATTRACTING CHARGED PARTICLES AND METHOD FOR USING THE SAME

(71) Applicant: TAIWAN SEMICONDUCTOR MANUFACTURING COMPANY, LTD., Hsinchu (TW)

(72) Inventors: Yen-An Chen, Hsinchu County (TW); Li-Jui Chen, Hsinchu (TW); Heng-Hsin Liu, New Taipei (TW); Tzung-Chi Fu, Miaoli County (TW); Han-Lung Chang, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 1 day.

(21) Appl. No.: 17/331,985

(22) Filed: May 27, 2021

(65) Prior Publication Data

US 2022/0382173 A1 Dec. 1, 2022

(51) Int. Cl.
*G03F 7/20* (2006.01)
*G03F 1/38* (2012.01)
*G03F 7/00* (2006.01)

(52) U.S. Cl.
CPC .......... *G03F 7/70925* (2013.01); *G03F 1/38* (2013.01)

(58) Field of Classification Search
CPC .......... G03F 7/70733; G03F 7/70925
See application file for complete search history.

(56) References Cited

U.S. PATENT DOCUMENTS

| | | | |
|---|---|---|---|
| 8,764,995 B2 | 7/2014 | Chang et al. | |
| 8,796,666 B1 | 8/2014 | Huang et al. | |
| 8,828,625 B2 | 9/2014 | Lu et al. | |
| 8,841,047 B2 | 9/2014 | Yu et al. | |
| 8,877,409 B2 | 11/2014 | Hsu et al. | |
| 9,093,530 B2 | 7/2015 | Huang et al. | |
| 9,184,054 B1 | 11/2015 | Huang et al. | |
| 9,256,123 B2 | 2/2016 | Shih et al. | |
| 9,529,268 B2 | 12/2016 | Chang et al. | |
| 9,548,303 B2 | 1/2017 | Lee et al. | |
| 2014/0253887 A1* | 9/2014 | Wu | G03F 1/82 355/30 |
| 2020/0103769 A1* | 4/2020 | Chen | B08B 1/00 |
| 2021/0041795 A1* | 2/2021 | Bruls | G03F 7/70916 |
| 2021/0132515 A1* | 5/2021 | Jang | G03F 7/70808 |

* cited by examiner

*Primary Examiner* — Steven Whitesell Gordon
(74) *Attorney, Agent, or Firm* — Birch, Stewart, Kolasch & Birch, LLP

(57) ABSTRACT

A method includes transporting a cleaning mask and a photomask into an enclosure of a lithography exposure apparatus, wherein the photomask includes a multilayered mirror structure, and the cleaning mask is free of the multilayered mirror structure; placing the cleaning mask on a reticle stage of the lithography exposure apparatus; and charging the cleaning mask to attract charged particles in the enclosure.

20 Claims, 29 Drawing Sheets

MASK FOR ATTRACTING CHARGED PARTICLES AND METHOD FOR USING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometric size (i.e., the smallest component (or line) that can be created using a fabrication process) has decreased. This scaling-down process generally provides benefits by increasing production efficiency and lowering associated costs. Such scaling-down has also increased the complexity of processing and manufacturing ICs.

A lithography exposure process forms a patterned photoresist layer for various patterning processes, such as etching or ion implantation. In a lithography exposure process, a photosensitive layer (resist) is applied to a surface of a semiconductor substrate, and an image of features defining parts of the semiconductor device is provided on the layer by exposing the layer to a pattern of high-brightness light. As semiconductor processes evolve to provide for smaller critical dimensions, and devices become smaller and increase in complexity, including the number of layers, a way of accurately patterning the features is needed in order to improve the quality, reliability, and yield of the devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
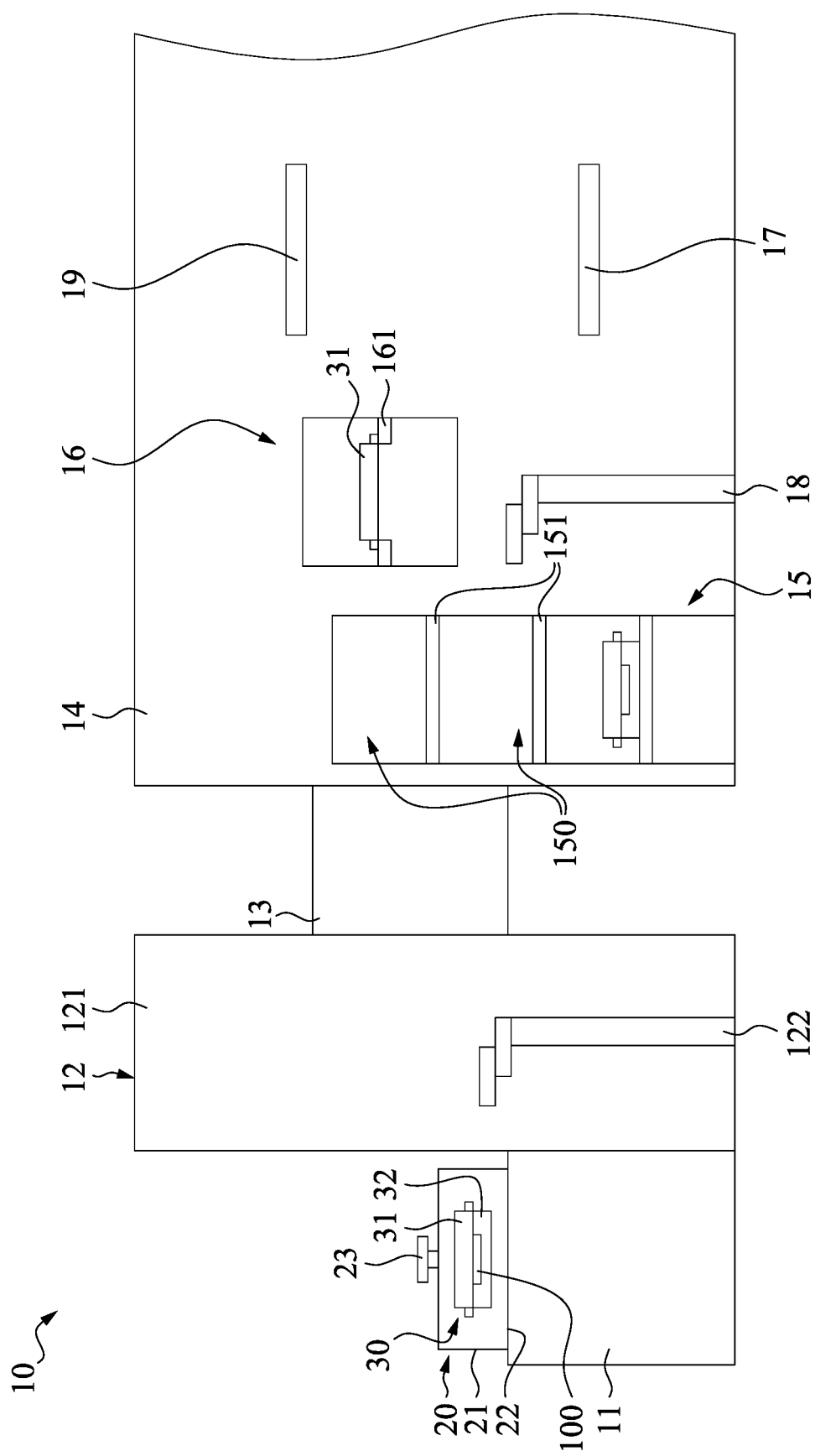
FIG. 1 shows a schematic diagram of a portion of a lithography exposure apparatus, according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" shall generally mean within 20 percent, or within 10 percent, or within 5 percent of a given value or range. Numerical quantities given herein are approximate, meaning that the term "around," "about," "approximately," or "substantially" can be inferred if not expressly stated. One of ordinary skill in the art will appreciate that the dimensions may be varied according to different technology nodes. One of ordinary skill in the art will recognize that the dimensions depend upon the specific device type, technology generation, minimum feature size, and the like. It is intended, therefore, that the term be interpreted in light of the technology being evaluated.

The advanced lithography process, method, and materials described in the current disclosure can be used in many applications, including fin-type field effect transistors (FinFETs). For example, the fins may be patterned to produce a relatively close spacing between features, for which the above disclosure is well suited. In addition, spacers used in forming fins of FinFETs can be processed according to the above disclosure.

Particle falling on a photomask will injure the pattern on a semiconductor wafer, which leads to an increase in cost and manufacturing time for rework. To address this issue, embodiments of the present disclosure provide a method for capturing particles in an enclosure of a lithography exposure apparatus by applying one or more cleaning masks. In some embodiments, the cleaning masks can be charged by using a reticle stage, and the charged cleaning masks can attract particles in the enclosure. With the mechanism for capturing particles, particle falling rate on the photomask is reduced and the wafer yield is improved.

FIG. 1 shows a schematic diagram of a portion of a lithography exposure apparatus 10, in accordance with some embodiments. The lithography exposure apparatus 10 may also be generically referred to as a scanner that is operable to perform lithography exposing processes with respective radiation source (e.g., a EUV source) and exposure mode using a reticle 40. In the present disclosure, the terms mask, and reticle are used interchangeably.

As shown in FIG. 1, the lithography exposure apparatus 10 includes a load port 11, an interface module 12, a load lock chamber 13, an enclosure 14, a reticle library 15, an upper lid handling chamber 16, a reticle exchanging station 17, a transfer mechanism 18, and a reticle stage 19, in accordance with some embodiments.

The load port 11 is configured to load a transport pod 20 for storing one or more masks M. The carrier 30 is configured so that the transport pod 20 can fit around the carrier 30. The upper lid 31 and the baseplate 32 collectively define a space for receiving a mask 100. When the mask 100 is transported to the load port 11, the carrier 30 is located in the transport pod 20, and the mask 100 is located in the carrier 30. As a result, further protection for the mask 100 is provided.

The interface module 12 is configured to handle the carrier 30 from the transport pod 20. The load lock chamber 13 is located between the interface module 12 and the enclosure 14. The load lock chamber 13 is configured for preserving the atmosphere within the enclosure 14 by separating it from the interface module 12. The load lock chamber 13 is capable of creating an atmosphere compatible with the enclosure 14 or the interface module 12, depending on where the loaded carrier 30 is scheduled to be next. This can be performed by altering the gas content of the load lock chamber 13 by such means as adding gas or creating a vacuum, along with other suitable means for adjusting the atmosphere in the load lock chamber 13.

The enclosure 14 preserves a vacuum environment at an ultra-high vacuum pressure. The reticle library 15, the upper lid handling chamber 16, the reticle exchanging station 17 and the reticle stage 19 are positioned in the enclosure 14. The reticle library 15 is configured to store one or more than one carriers 30 in the enclosure 14. In some embodiments, the reticle library 15 includes a number of storing spaces 150.

The reticle stage 19 is configured for securing the mask 100 during the lithography exposure process. In some embodiments, the reticle stage 19 includes an E-chuck which creates a clamping force by generating an electrostatic field.

The reticle exchanging station 17 is configured to support the baseplate 32 of the carrier 30 before the mask 100 is secured by the reticle stage 19 or after the baseplate 32 is released from the reticle stage 19. In some embodiments, the reticle exchanging station 17 is positioned relative to the reticle stage 19. In some other embodiments, the reticle exchanging station 17 is able to be moved by a driving member, such as linear motor (not shown in figures). To place the mask 100 on a preset position of the reticle stage 19, an alignment tool (such as a camera, not shown in figures) produces information about the position of the reticle exchanging station 17 and/or the reticle stage 19, and the reticle exchanging station 17 is moved by using the information from the alignment tool to perform an alignment process on the reticle exchanging station 17 relative to the reticle stage 19.

Figure 2:
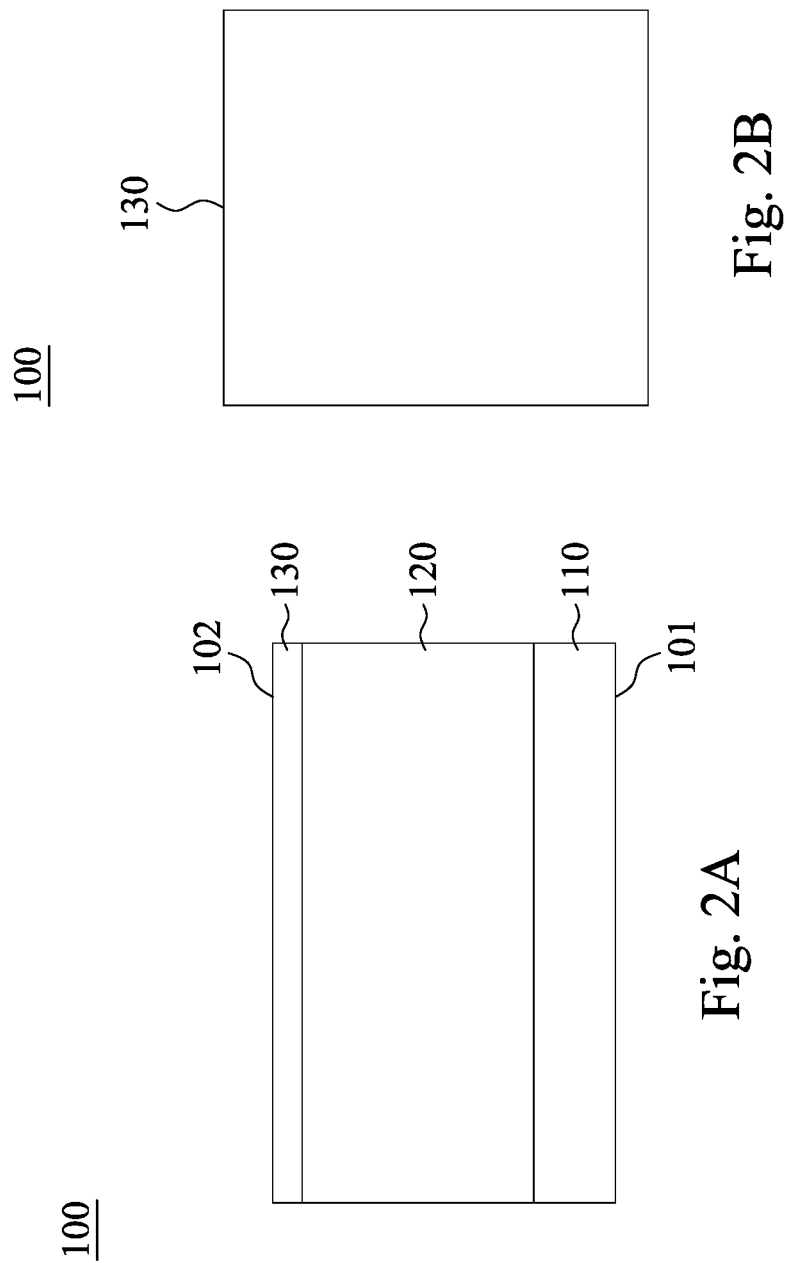
FIG. 2A shows a cleaning mask according to some embodiments of the present disclosure.
FIG. 2B shows a top view of the cleaning mask in FIG. 2A according to some embodiments of the present disclosure.

In some embodiments, one or more cleaning masks can be transported into the enclosure 14 to remove particles in the enclosure 14. FIG. 2A shows a cleaning mask 100 according to some embodiments of the present disclosure. In some embodiments of the present disclosure, the cleaning mask 100 has a first layer 110, a second layer 120, and a third layer 130. The third layer 130 is a top layer for attracting and/or repelling charged particles. In some embodiments, the third layer 130 absorbs extreme ultraviolet light, and has a thickness between about 5 nanometers and about 80 nanometers. The first layer 110 is a base, which can be held onto the electrically charged reticle stage 19 (see FIG. 1), and has a thickness between about 5 nanometers and about 70 nanometers. The cleaning mask 100 is free of a multi-layered mirror structure (such as the reflective ML structure 230 in FIG. 4). The second layer 120 is a conductive layer arranged over the first layer 110, and the third layer 130 is arranged over the second layer 120. In other words, the second layer 120 of the cleaning mask 100 is sandwiched between the first layer 110 and the third layer 130 of the cleaning mask 100. Moreover, the second layer 120 contacts the first layer 110 and the third layer 130. The overall thickness of the cleaning mask 100 can be between about 4 millimeters and about 6.5 millimeters.

The cleaning mask 100 has a first face 101 on an outer side of the first layer 110, and a second face 102 on an outer side of the third layer 130. In some embodiments of the present disclosure, the first layer 110 is made of a tantalum compound, the second layer 120 is made of a conductive or semiconductive material, and the third layer 130 is made of a tantalum compound. Specifically, the first layer 110 can be made of tantalum boride, tantalum boride oxide, tantalum boride nitride, or the like. The third layer 130 can be made of tantalum boride, tantalum boride oxide, tantalum boride nitride, or the like. The second layer 120 can be made of metal, a semiconductor material, or the like.

The first layer 110, the second layer 120, and the third layer 130 are made of conductive or semiconductive materials, such that the cleaning mask 100 can be electrically conductive throughout its entire thickness when the cleaning mask 100 is clamped by the reticle stage 19 (see FIG. 1). Specifically, the first layer 110 and the third layer 130 are in electrical conduction to each other, and the first face 101 and the second face 102 of the cleaning mask 100 are in electrical conduction with each other.

FIG. 2B is a top view of the cleaning mask 100 in FIG. 2A. The cleaning mask 100 does not pattern images onto a photoresist layer of a process wafer, and thus the third layer 130 of the cleaning mask can over 80% to 100% of the second layer 120. In other words, the top layer 130 has a first area in a top view, and the conductive layer 120 has a second area in the top view, and a ratio of the first area to the second area is in a range of about 80% to about 100%. When the ratio of the first area to the second area is below 80%, the ability of the top layer 130 to attract or repel charged particles is decreased.

Figure 3:
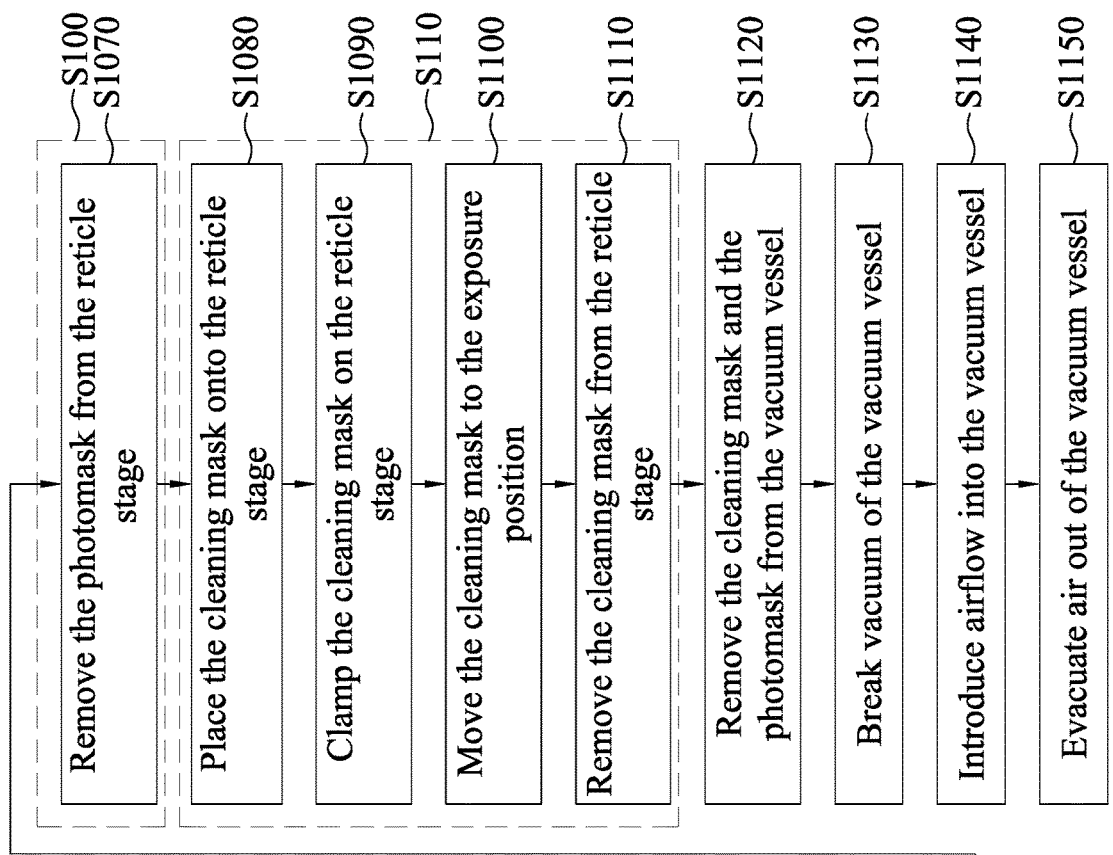
FIG. 3 shows a flowchart of a method according to some embodiments of the present disclosure.

FIG. 3 shows a flowchart of a method M10 according to some embodiments of the present disclosure. In some embodiments of the present disclosure, a method of using a cleaning mask for attracting charged particles in an enclosure includes the following operations. For illustration, the flow chart will be described along with the drawings shown in FIGS. 1 and 5-18. The method M10 is merely an example, and is not intended to limit the present disclosure beyond what is explicitly recited in the claims. Additional operations can be provided before, during, and after the method M10, and some operations described can be replaced, eliminated, or moved around for additional embodiments of the process. For clarity and ease of explanation, some elements of the figures have been simplified.

Figure 4:
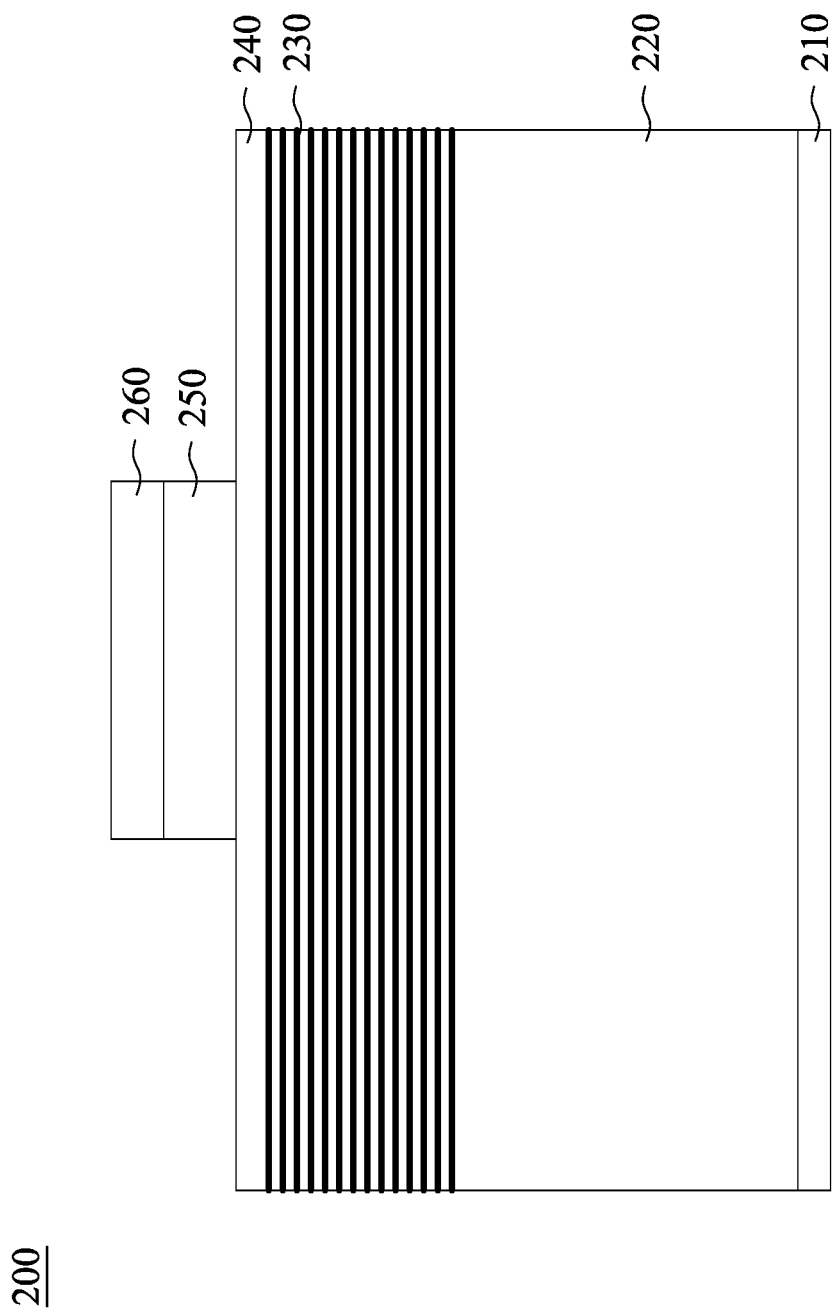
FIG. 4 shows a photomask according to some embodiments of the present disclosure.

The method M10 begins with operation S1010, a cleaning mask and a photomask are transported into an enclosure of a lithography exposure apparatus. FIG. 4 shows a photomask according to some embodiments of the present disclosure. The photomask 200 includes a conductive layer 210, a mask substrate 220, a reflective multilayer (ML) structure 230, a capping layer 240, an absorption layer 250, and an anti-reflective coating (ARC) 260. The mask substrate 220 may be made of a suitable material, such as a low thermal expansion material (LTEM) or fused quartz. In some embodiments, the LTEM includes $TiO_2$ doped $SiO_2$, or other suitable materials with low thermal expansion. The reflective ML structure 230 is electrically insulating. In some embodiments, the reflective ML structure 230 is a multi-layered mirror structure made of alternating layers of molybdenum and silicon, which can reflect extreme ultraviolet light. The conductive layer, 210 can be made of an electrically conductive material such as tantalum boride, such that the photomask 200 can be held onto the reticle stage 19 by an electric charge at the reticle stage 19. The absorption layer 250 and the ARC 260 form a patterned layer and cover the reflective ML structure 230 partially, such that portions of the reflective ML structure 230 are exposed. The absorption layer 250 can be made of tantalum boride and tantalum boride nitride, which can absorb extreme ultraviolet light. In some embodiments, the capping layer 240 is a rubidium layer. In some embodiments, a thickness of the absorption layer 250 and the ARC 260 is between about 5 nanometers and about 80 nanometers, a thickness of the conductive layer, 210 is between about 5 nanometers and about 70 nanometers, and a thickness of the photomask 200 is between about 4 millimeters and about 6.5 millimeters.

Figure 5:
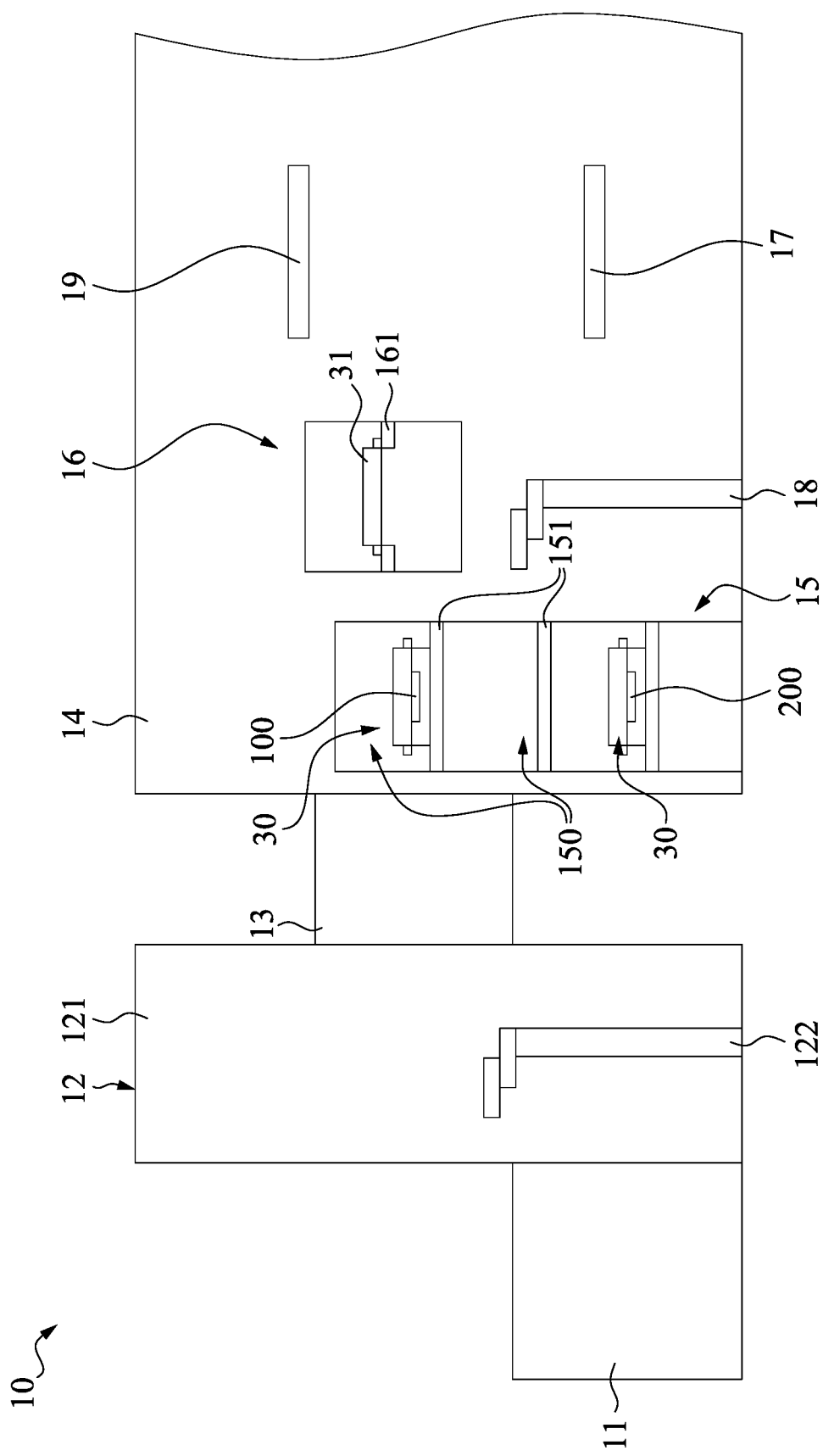
FIGS. 5-9 show a schematic diagram of a portion of a lithography exposure apparatus, according to some embodiments of the present disclosure.

As shown in FIGS. 1 and 5, carriers 30 along with the cleaning mask 100 or the photomask 200 supported by the carriers 30 are transported into the enclosure 14. In some embodiments, the carrier 30 which contain the cleaning mask 100 or the photomask 200 is moved in the lithography exposure apparatus 10 from the transport pod 20 to the reticle exchanging station 17. In some embodiments, the transport pod 20 which contains the carrier 30 is placed on the load port 11 of the lithography exposure apparatus 10, as shown in FIG. 1. After the transport pod 20 is placed on the load port 11, the carrier 30 is removed from the transport pod 20 by the robotic arm 122 and moved toward the load lock chamber 13.

When the carrier 30 is placed in the load lock chamber 13, the robotic arm 122 returns to the housing 121. At this time, the load lock chamber 13 is sealed and an atmosphere compatible with the vacuum pressure in the enclosure 14 is created by altering the gas content of the load lock chamber 13 by such means as adding gas or creating a vacuum, along with other suitable means for adjusting the atmosphere in the load lock chamber 13. When the desired atmosphere has been reached, the transfer mechanism 18 removes the carrier 30 from the load lock chamber 13. As a result, the carrier 30, along with the cleaning mask 100, is moved from an ambient environment (i.e., space in the transport pod 20 and the housing 121) to a vacuum environment (i.e. space in the enclosure 14).

In some embodiments, after the carrier 30 is moved into the vacuum environment, the carrier 30 is transferred to the reticle library 15 by the transfer mechanism 18. In some embodiments, the reticle library 15 stores more than one carriers 30, and the cleaning mask 100 and the photomask 200 are deposited in the carriers 30, respectively. With the arrangement of the reticle library 15, the time for exchanging the cleaning mask 100 and the photomask 200 in the lithography exposure apparatus 10 is reduced.

Figure 6:
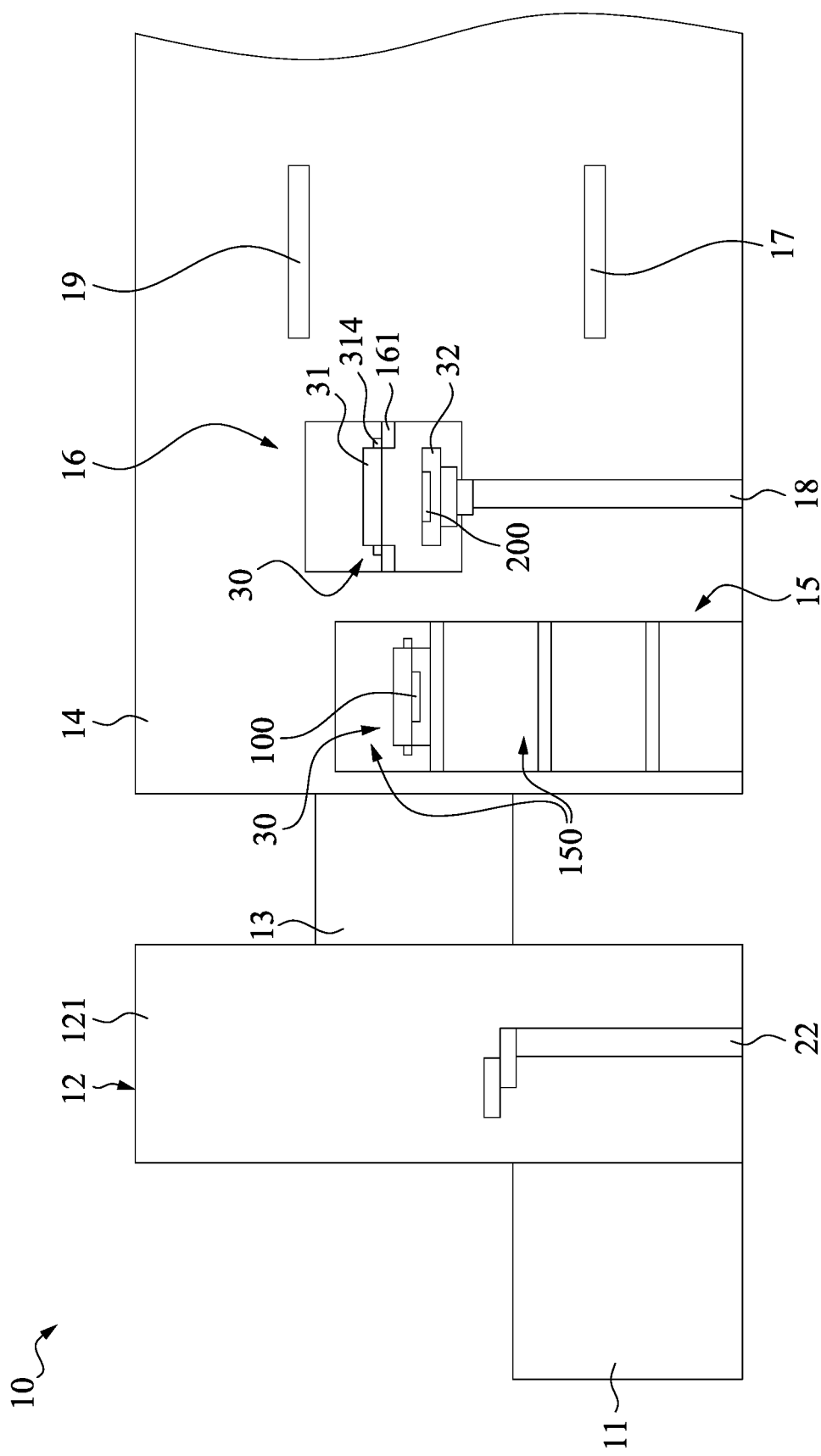

In operation S1020 of FIG. 3, the photomask is placed onto the reticle stage. To mount the photomask 200 to the reticle stage 19, the transfer mechanism 18 pulls the carrier 30 containing the photomask 200 from the reticle library 15 and brings it to the upper lid handling chamber 16, as shown in FIG. 6. In the upper lid handling chamber 16, the flanges 314 of the upper lid 31 are supported by the holding members 161, and the upper lid 31 is left on the holding members 161 by moving the baseplate 32 downwardly. As a result, the upper lid 31 is removed from the baseplate 32. At this time, the photomask 200 is placed on the baseplate 32.

Figure 7:
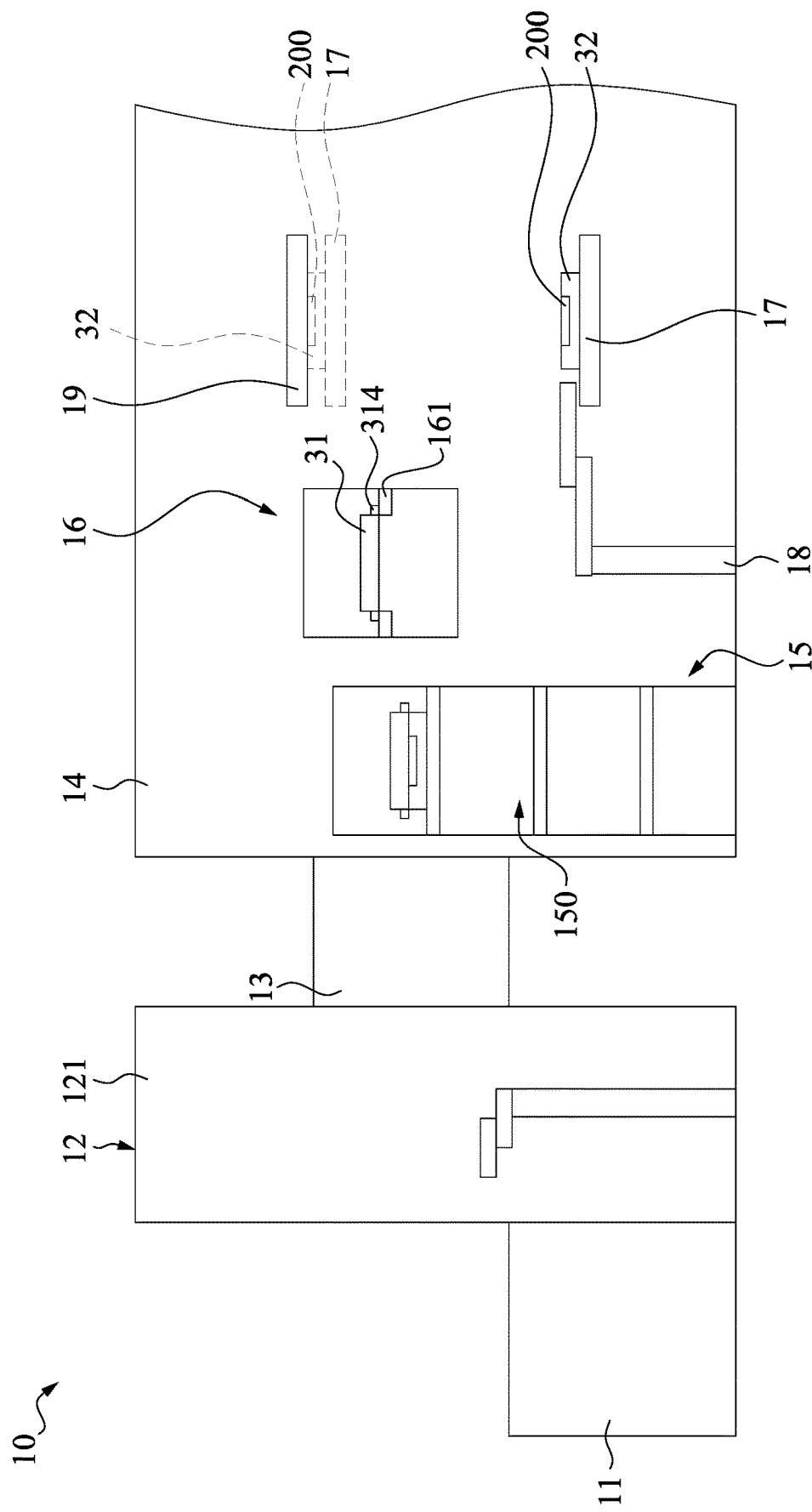
Figure 8:
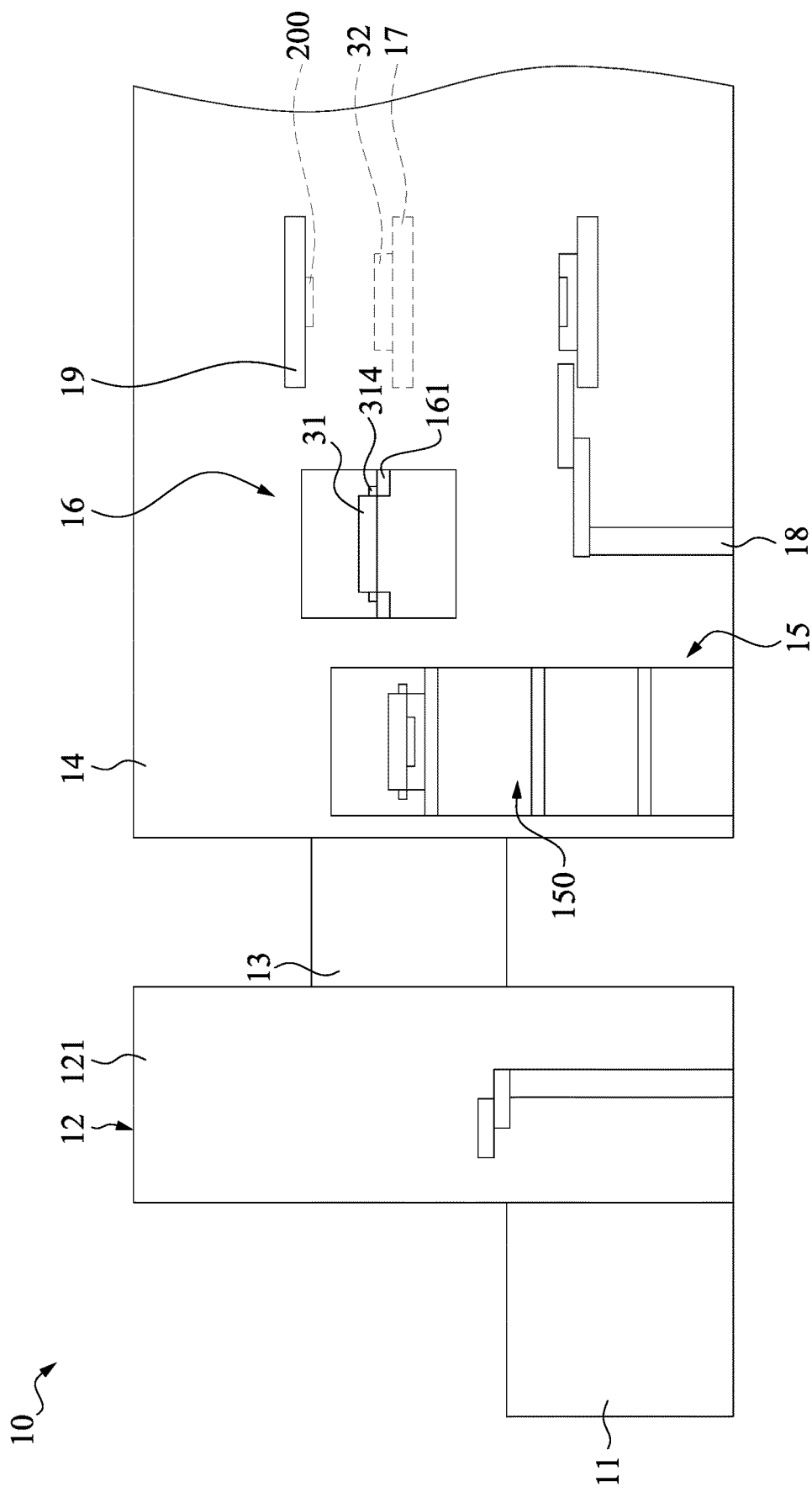
Figure 9:
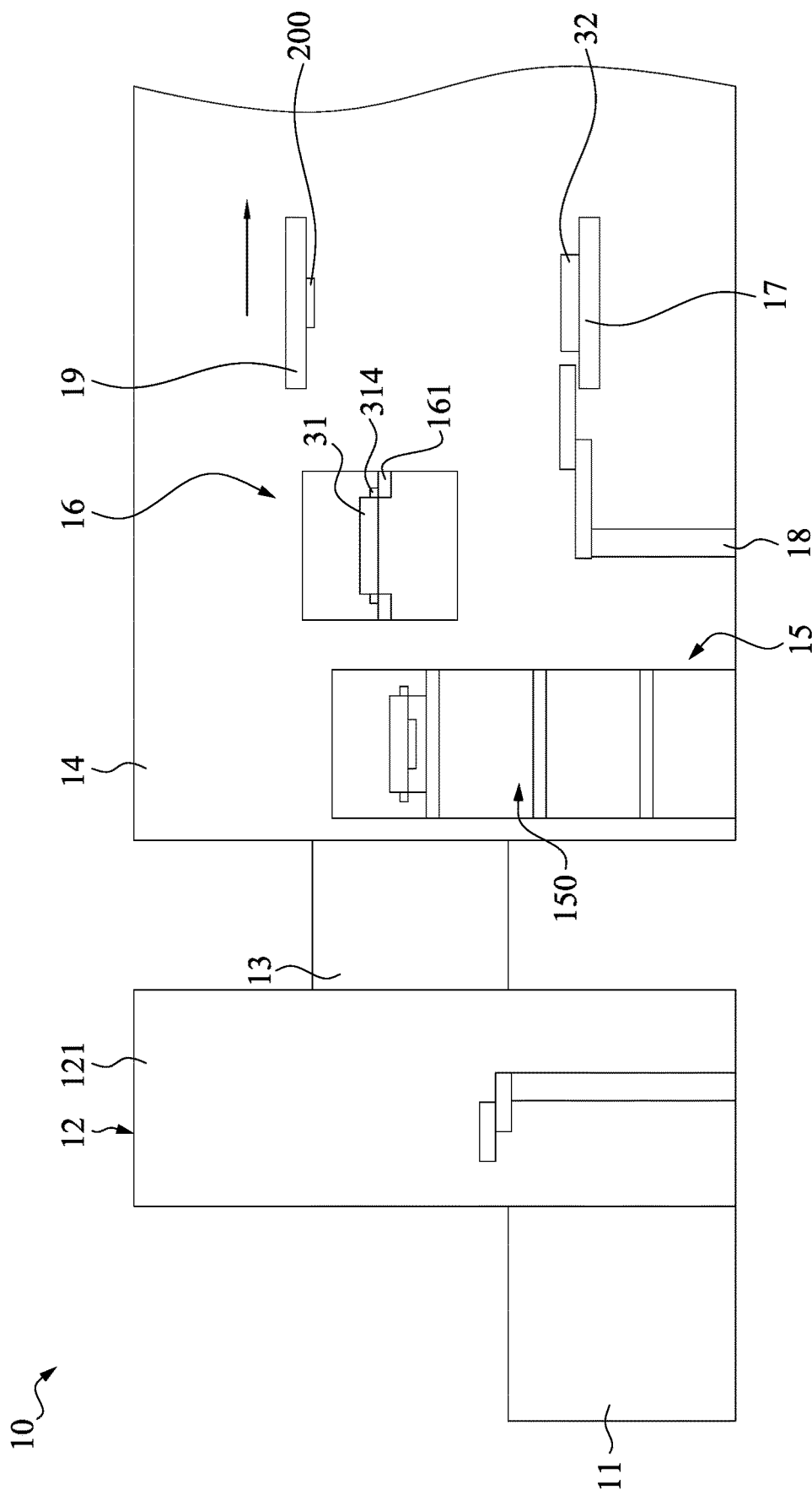

In some embodiments, after the upper lid 31 is removed from the baseplate 32, the baseplate 32 and photomask 200 are placed on the reticle exchanging station 17 by the transfer mechanism 18, as shown in FIG. 7. Afterwards, the reticle exchanging station 17 is elevated to a loading position as indicated by the dotted lines in FIG. 7 to create a direct contact between the bottom surface of the photomask 200 and the reticle stage 19. Thus, operation S1020 is completed.

The method M100 continues with operation S1030 of FIG. 3, in which the photomask is clamped on the reticle stage. For example, the E-chuck of the reticle stage 19 creates a clamping force by generating an electrostatic field, and the photomask 200 is secured by the reticle stage 19 with the clamping force generated by the reticle stage 19. After the photomask 200 is secured by the reticle stage 19, the vacant baseplate 32 is lowered down to its original position as indicated by solid lines in FIG. 8.

The method M100 continues with operation S1040 of FIG. 3, in which the photomask is moved to an exposure position. For example, the exposure position is a position where the photomask 200 is located during an exposure process. The photomask 200 is moved by the reticle stage 19 such that the photomask 200 is accurately positioned for the next operation. In some embodiments, the photomask 200 is moved with a first speed.

Figure 10:
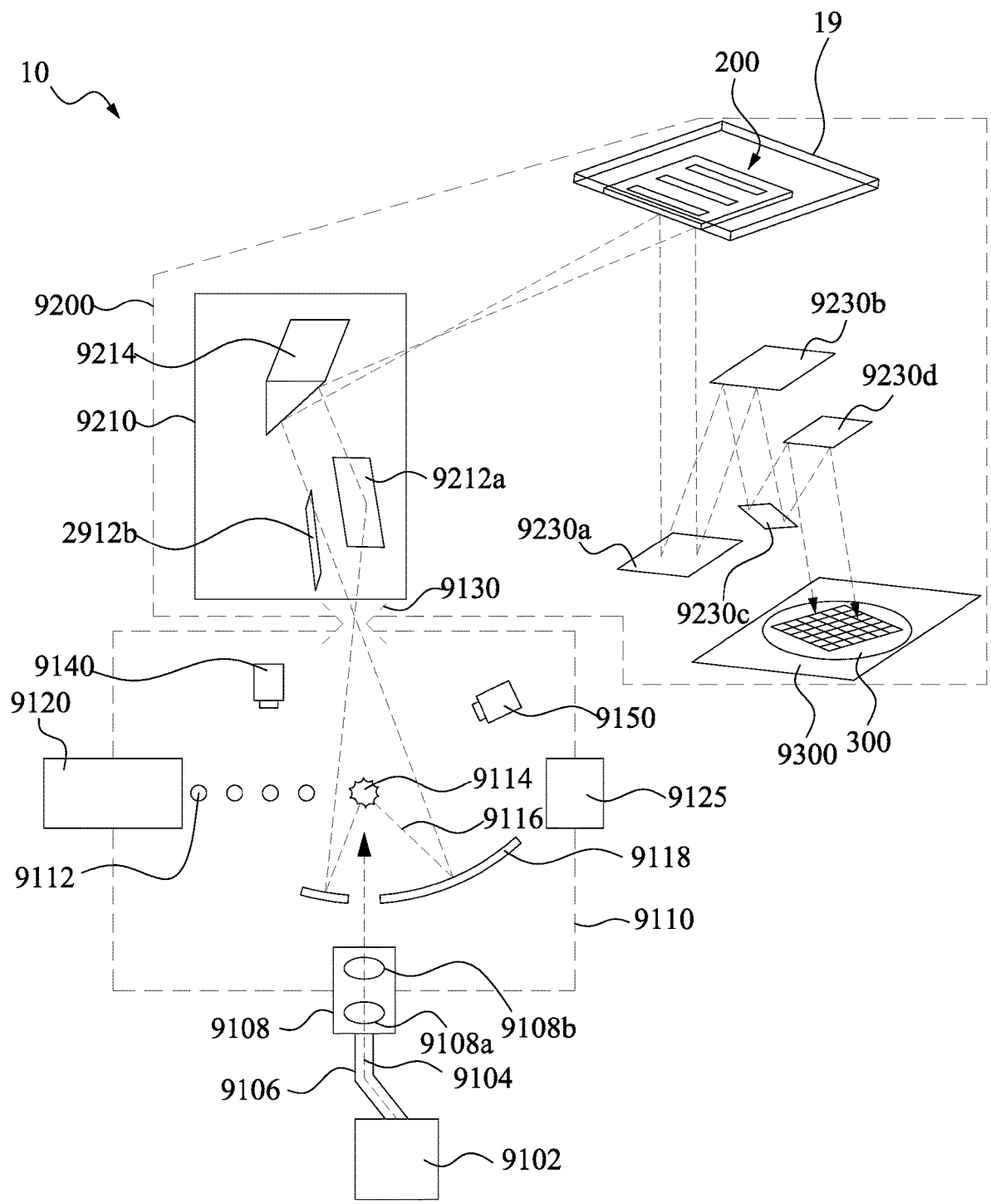
FIG. 10 shows a schematic view of another portion of the lithography exposure apparatus, according to some embodiments of the present disclosure.

FIG. 10 is a schematic view of another portion of the lithography exposure apparatus 10, in accordance with some embodiments. Although the lithography exposure apparatus 10 is illustrated as having a certain configuration of components, it will be appreciated that the disclosed lithography exposure apparatus 10 may include additional components (e.g., additional mirrors) or having less components (e.g., less mirrors).

The lithography exposure apparatus 10 further includes a EUV source vessel 9110. A fuel droplet generator 9120 is connected to the EUV source vessel 9110 and is configured to generate a plurality of fuel droplets 9112. In some embodiments, the fuel droplets 9112 generated by the fuel droplet generator 9120 are provided into the EUV source vessel 9110. In some embodiments, the fuel droplets 9112 may include tin (Sn). In some other embodiments, the fuel droplets 9112 may include a different metal material. In some embodiments, the EUV source vessel 9110 can also be referred to as a radiation source, in which radiation source employs a laser produced plasma (LPP) mechanism to generate plasma and further generate EUV light from the plasma.

The lithography exposure apparatus 10 may also include a droplet position detection system which may include a droplet imager 9140 disposed in the EUV source vessel 9110 that captures an image of one or more fuel droplets 9112. The droplet imager 9140 may provide this captured image to a droplet position detection feedback system (not shown), which can, e.g., generate a droplet position and trajectory in response to an analysis result of the captured image. The position detection feedback system can thus generate a droplet error in response to the generated droplet position and trajectory, e.g., based on a droplet-by-droplet basis, or on average. In some embodiments, the droplet imager 9140 may include a fine droplet steering camera (FDSC), a droplet formation camera (DFC), and/or suitable devices.

The lithography exposure apparatus 10 further includes a primary laser having a laser source 9102 configured to produce a laser beam 9104. In some embodiments, the laser source 9102 may include a multi-stage laser having a plurality of stages configured to amplify laser light produced by a prior stage. The laser beam 9104 passes through a beam transport system 9106 configured to provide the laser beam to a focusing system 9108. The focusing system 9108 includes one or more lenses 9108a, 9108b and/or mirrors arranged within a beam line and configured to focus the laser beam 9104. The laser beam 9104 is output from the focusing system 9108 to the EUV source vessel 9110.

The laser beam 9104 transmits through a collector mirror 9118 located within the EUV source vessel 9110. Then, the primary laser beam 9104 generated by the laser source 9102 intersects the fuel droplets 9112. In some embodiments, the primary laser beam 9104 may be a carbon dioxide ($CO_2$) laser. In some other embodiments, the primary laser beam 9104 may include alternative types of lasers. When the primary laser beam 9104 strikes the fuel droplets 9112, the primary laser beam 9104 heats the fuel droplets 9112 to a predetermined temperature. At the predetermined temperature, the fuel droplets 9112 shed their electrons and become a plasma 9114 including a plurality of ions. In some embodiments, the ions emit EUV radiation 9116 (e.g., having a wavelength of approximately 13.3 nm to about 13.7 nm).

In some embodiments, the collector mirror 9118 has a concave curvature. In some embodiments, the collector mirror 9118 may include a multi-layer coating having alternating layers of different materials. For example, in some embodiments, the collector mirror 9218 may include alternating layers of molybdenum and silicon configured to operate as a Bragg reflector. The concave curvature of the collector mirror 9218 focuses the EUV radiation 9116 generated by the plasma 9114 toward an intermediate focus (IF) unit 9130 within an exit aperture of the EUV source vessel 9110. The intermediate focus unit 9130 is located between the EUV source vessel 9110 and a scanner 9200 including optical elements configured to direct the EUV radiation 9116 to a workpiece (e.g., a semiconductor substrate). In some embodiments, the intermediate focus unit 9130 may include a cone shaped aperture configured to provide for separation of pressures between the EUV source vessel 9110 and the scanner 9200. In some embodiments, the intermediate focus unit 9130 may extend into the scanner 9200.

The lithography exposure apparatus 10 may also include an EUV energy monitor 9150 disposed in the EUV source vessel 9110. The EUV energy monitor 9150 is designed to monitor the EUV intensity or energy generated from the EUV source vessel 9110. For example, the EUV energy monitor 9150 includes an EUV sensing element, such as a diode, designed to be sensitive to the EUV light and configured to effectively detect the EUV light. In other examples, the EUV energy monitor 9150 includes a plurality of diodes configured in an array to effectively detect the EUV light for monitoring purpose. In some embodiments, a dose error is calculated based on the sensed EUV intensity (or energy). For example, when the sensed EUV intensity (or energy) is below a predetermined threshold value, such situation can be referred to as a dose error. In some embodiments, the dose error is related to the plasma instability, through monitoring the EUV intensity by the EUV energy monitor 9150, the dose error can be extracted from the monitored EUV intensity. Therefore, when a dose error is occurred, it indicates that the plasma 9114 is unstable.

In some embodiments, the lithography exposure apparatus 10 further includes a droplet collection element 9125 disposed in the EUV source vessel 9110 and located opposite to the droplet generator 9120. The droplet collection element 9125 is configured to collect fuel droplets 9112 that are not vaporized during formation of the EUV radiation 9116 and/or fragments of fuel droplets 9112 generated during formation of the EUV radiation 9116.

The EUV radiation 9116 output from the EUV source vessel 9110 is provided to a condenser 9210 by way of intermediate focus unit 9130. In some embodiments, the condenser 9210 includes first and second surfaces 9212a and 9212b configured to focus the EUV radiation 9116, and a reflector 9214 configured to reflect the EUV radiation 9116 towards the photomask 200. The photomask 200 is configured to reflect the EUV radiation 9116 to form a pattern on a surface of a semiconductor wafer 9250. To produce the pattern, the photomask 200 may include the absorption layer 250 (see FIG. 4) arranged on a front surface of the photomask 200. The absorption layer 250 is configured to absorb the EUV radiation 9116, such that the reflected rays of EUV radiation 9116 conveys a patterned defined by the photomask 200.

To pattern a desired image, the absorption layer 250 may expose a portion of the reflective ML structure 230. In a top view, an area of the absorption layer 250 is less than 80% of an area of the reflective ML structure 230, such that a portion of the reflective ML structure 230 is exposed, for reflecting extreme ultraviolet light and imaging a desired pattern.

The EUV radiation 9116 is filtered through reduction optics including a series of first to fourth mirrors 9230a, 9230b, 9230c, and 9230d, which serve as lenses to reduce a size of the pattern carried by the EUV radiation 9116. In some embodiments, the fourth mirror 9230d conveys the EUV radiation 9116 onto a on a layer of photoresist disposed on a surface of the semiconductor wafer 9250. The EUV radiation 9116 irradiates particular regions of the layer of photoresist based on the pattern carried by the EUV radiation 9116, and thus the layer of irradiated photoresist layer can be patterned after developing it. Therefore, subsequent processing can be performed on selected regions of the semiconductor wafer 9250.

In operation 51050 of FIG. 3, a wafer is placed on a wafer stage of the lithography exposure apparatus. For example, in FIG. 10, the wafer 300 is disposed on the wafer stage 9300. In operation S1060 of FIG. 3, an exposure process is performed to the wafer with the photomask. For example, in FIG. 10, the laser source 9102 is turned on to produce the laser beam 9104, which hits the fuel droplets 9112, which become the plasma 9114. The ions of the plasma 9114 then emit EUV radiation 9116, which impinges on the photomask 200. The EUV radiation 9116 is then patterned to be an image, and the image is incident on the wafer 300 to exposure a photoresist layer on the wafer 300. Specifically, the image is patterned onto the photoresist layer by reflecting extreme ultraviolet light off of the exposed regions of the reflective ML structure 230.

Figure 11:
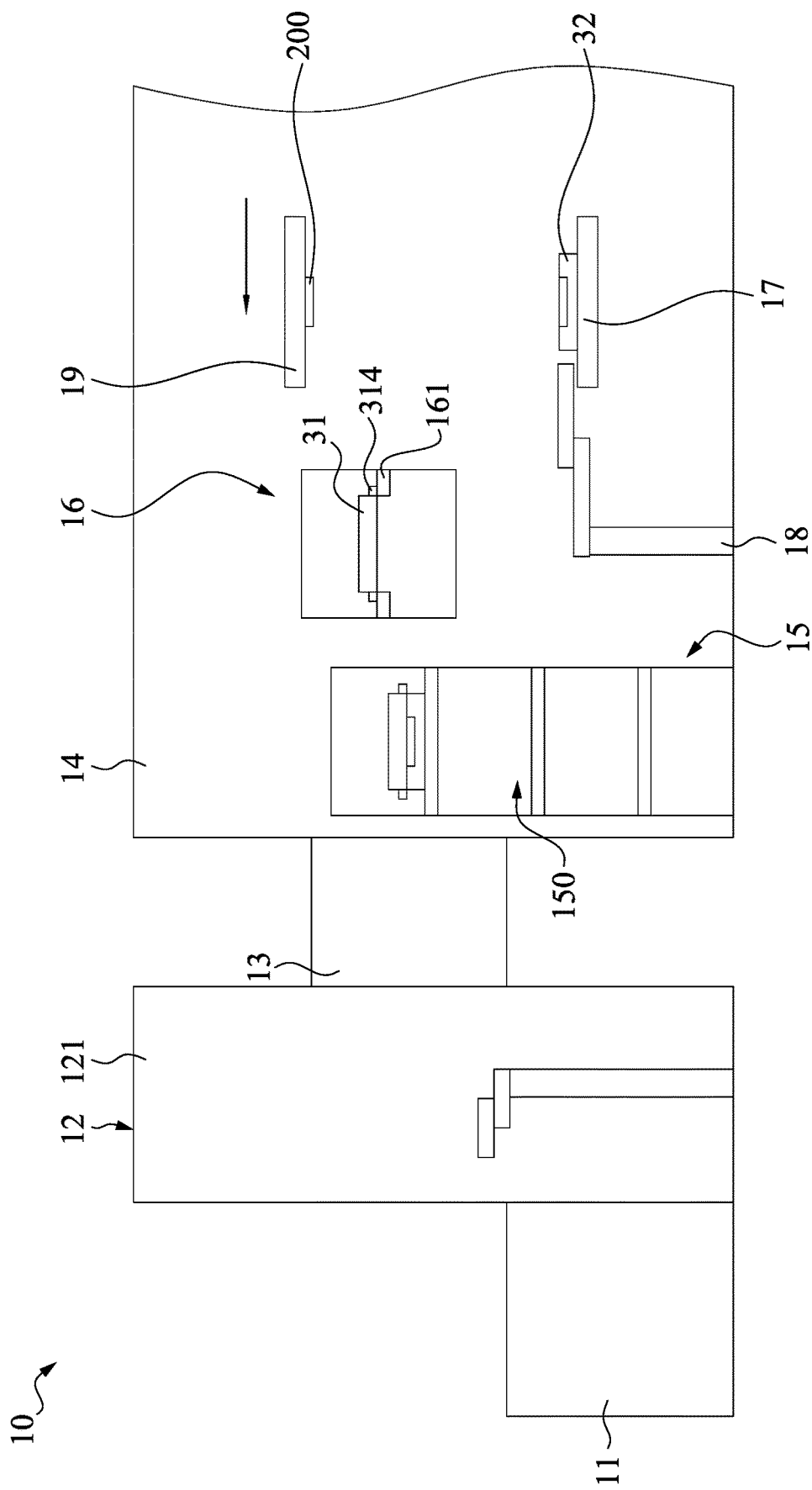
FIGS. 11-14 show a schematic diagram of a portion of a lithography exposure apparatus, according to some embodiments of the present disclosure.
Figure 12:
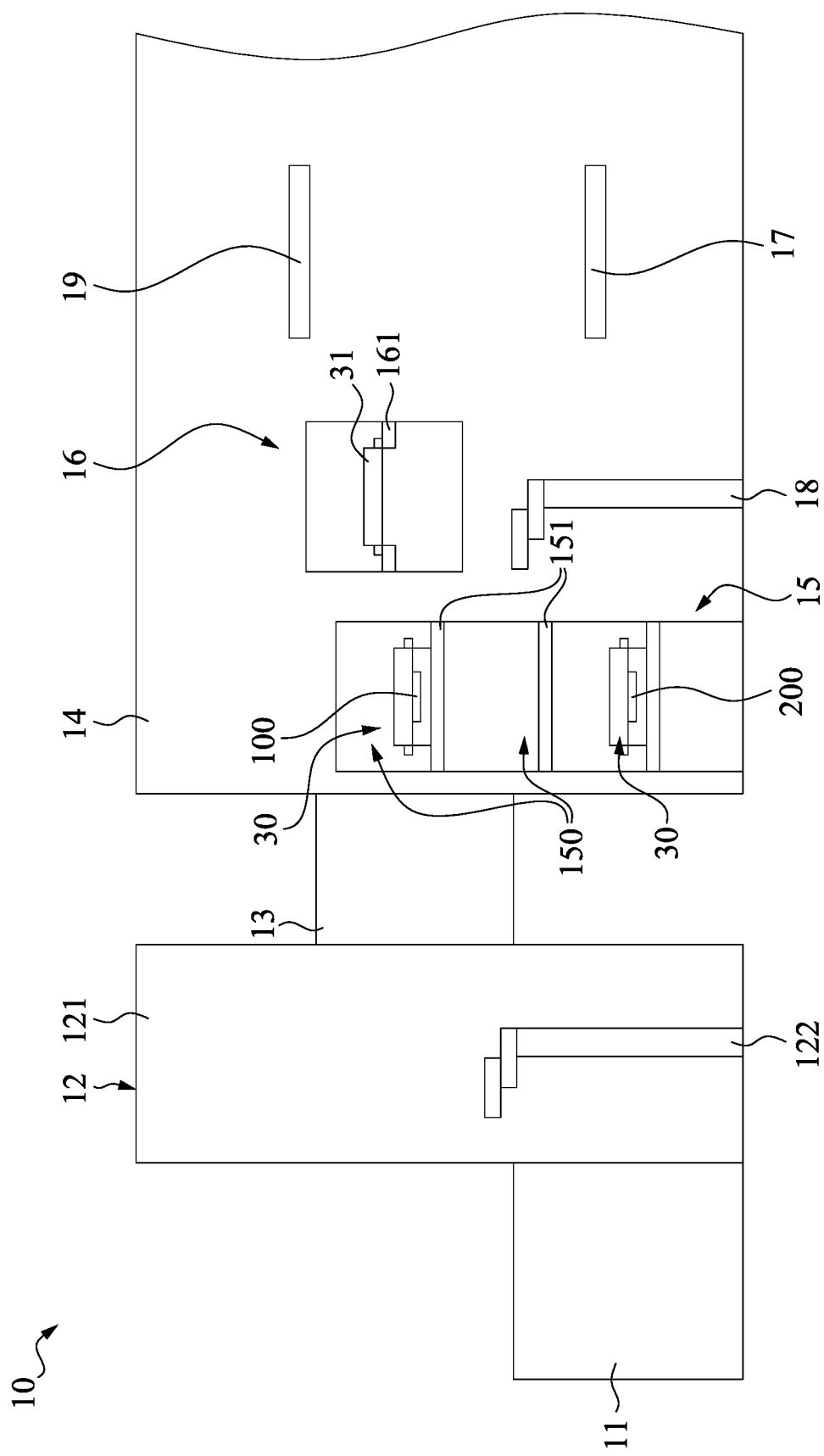

In operation S1070 of FIG. 3, the photomask is removed from the reticle stage. Specifically, as shown in FIGS. 10 and 11, after the exposure process with the photomask 200 is completed, the laser source 9102 is turned off, and the reticle stage 19 moves the photomask 200 back to the position above the reticle exchanging station 17. The reticle exchanging station 17 then moves upward, such that the baseplate 32 contacts the photomask 200. The reticle stage 19 then halts clamping the photomask 200, such that the photomask 200 is back to the baseplate 32. The photomask 200 and the baseplate 32 are then back to the upper lid handling chamber 16, and the upper lid 31 covers the photomask 200 and the baseplate 32, such that the photomask 200 is stored in its carrier 30. The photomask 200 and its carrier 30 are then back to the reticle library 15, as shown in FIG. 12. In some embodiments, during the operation S1070, the wafer 300 with the exposed photoresist layer is removed from the wafer stage 9300. In some embodiments, the operations S1020 to operation S1070 are referred to as an operation S100 (photomask operation).

Figure 13:
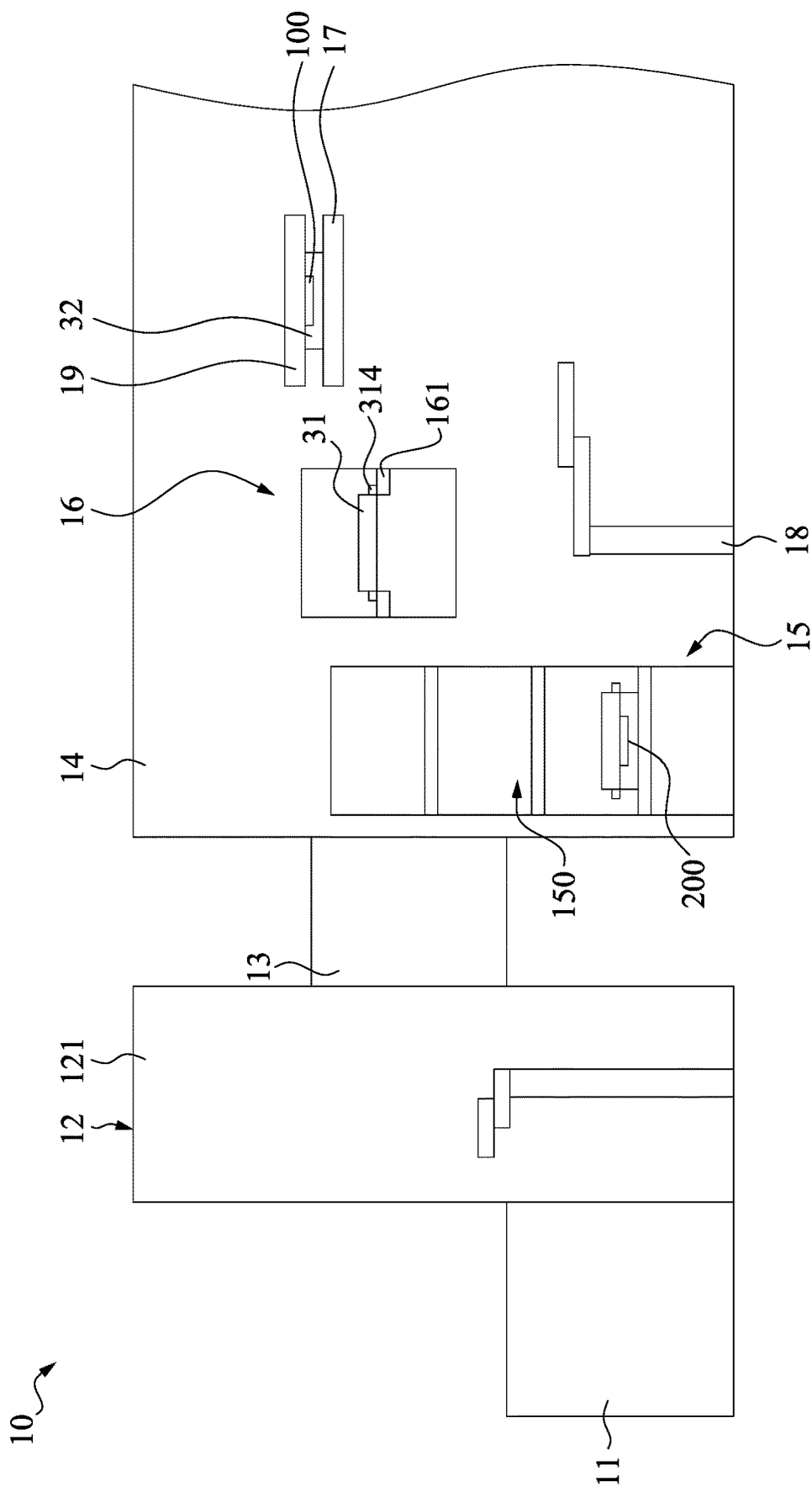

In operation S1080 of FIG. 3, the cleaning mask is placed onto the reticle stage. As shown in FIGS. 12 and 13, to mount the cleaning mask 100 to the reticle stage 19, the transfer mechanism 18 pulls the carrier 30 containing the cleaning mask 100 from the reticle library 15 and brings it to the upper lid handling chamber 16. In the upper lid handling chamber 16, the flanges 314 of the upper lid 31 are supported by the holding members 161, and the upper lid 31 is left on the holding members 161 by moving the baseplate 32 downwardly. As a result, the upper lid 31 is removed from the baseplate 32. At this time, the cleaning mask 100 is placed on the baseplate 32.

In some embodiments, after the upper lid 31 is removed from the baseplate 32, the baseplate 32 and cleaning mask 100 are placed on the reticle exchanging station 17 by the transfer mechanism 18. Afterwards, the reticle exchanging station 17 is elevated to a loading position to create a direct contact between the bottom surface of the cleaning mask 100 and the reticle stage 19. Thus, operation S1080 is completed.

In operation S1090 of FIG. 3, the cleaning mask is clamped on the reticle stage. For example, in FIG. 14, the E-chuck of the reticle stage 19 creates a clamping force by generating an electrostatic field, and the cleaning mask 100 is secured by the reticle stage 19 with the clamping force generated by the reticle stage 19. After the cleaning mask 100 is secured by the reticle stage 19, the vacant baseplate 32 is lowered down to its original position.

Figure 19A:
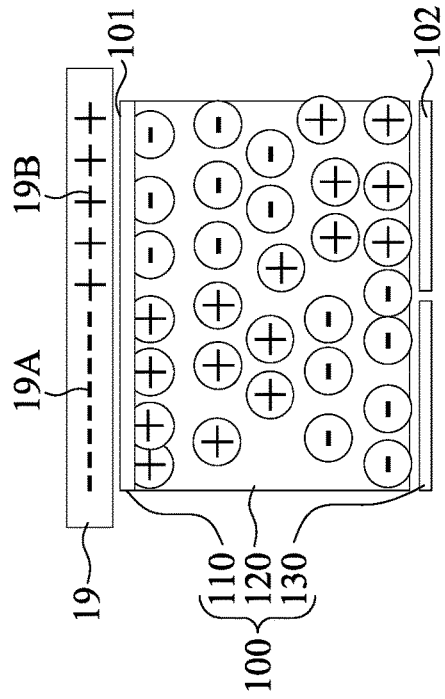
FIG. 19A shows a side view of a cleaning mask held onto a reticle stage according to some embodiments of the present disclosure
Figure 19B:
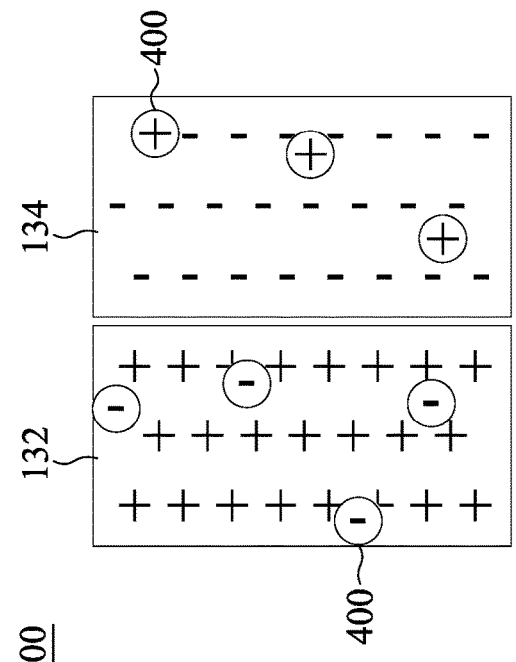
FIG. 19B shows a top view of the cleaning mask in FIG. 19A.

FIG. 19A shows the cleaning mask 100 held onto the reticle stage 19 according to some embodiments of the present disclosure, and FIG. 19B shows a top view of the cleaning mask 100 in FIG. 19A. When the cleaning mask 100 is placed on the reticle stage 19 that is electrically charged, electrons inside the cleaning mask 100 are attracted or repulsed by the charges of the reticle stage 19, and thereby creates charges at the face of the cleaning mask 100 facing away from the reticle stage 19. The cleaning mask 100 is charged to attract charged particles in the enclosure 14. The charge created on the second face 102 of the cleaning mask 100 is induced by the same electric force that holds the cleaning mask 100 on the reticle stage 19. In other words, the charges on the second face 102 of the cleaning mask 100 are induced by the charges on the reticle stage 19. Specifically, a charge on the reticle stage 19 creates a similar charge on the face of the cleaning mask 100 facing away from the reticle stage 19, due to electrical conduction between the two opposite faces of the cleaning mask 100. In some embodiments, there is an isolation layer on a surface of the reticle stage 19 that facing the cleaning mask 100.

Specifically, if the second face 102 of the cleaning mask 100 faces the reticle stage 19 and the reticle stage 19 is negatively charged, electrons inside the cleaning mask 100 are pushed toward the first face 101 of the cleaning mask 100 which becomes negatively charged. If the second face 102 of the cleaning mask 100 faces the reticle stage 19 and the reticle stage 19 is positively charged, electrons inside the cleaning mask 100 are attracted toward the second face 102 of the cleaning mask 100, and the first face 101 of the cleaning mask 100 becomes positively charged. Similarly, if the first face 101 of the cleaning mask 100 faces the reticle stage 19 and the reticle stage 19 is negatively charged, electrons inside the cleaning mask 100 are pushed toward the second face 102 of the cleaning mask 100 which becomes negatively charged. If the first face 101 of the cleaning mask 100 faces the reticle stage 19 and the reticle stage 19 is positively charged, electrons inside the cleaning mask 100 are attracted toward the first face 101 of the cleaning mask 100, and the second face 102 of the cleaning mask 100 becomes positively charged. Namely, when the cleaning mask 100 is placed on the reticle stage 19, a charge on the reticle stage 19 creates a similar charge on the face of the cleaning mask 100 facing away from the reticle stage 19, due to electrical conduction between the two opposite faces of the cleaning mask 100.

In some embodiments of the present disclosure, a first stage portion 19a of the reticle stage 19 is positively charged, and a second stage portion 19B of the reticle stage 19 is negatively charged. As such, the third layer 130 of the cleaning mask 100 includes a first portion 132 which is positively charged and a second portion 134 which is negatively charged as shown in FIGS. 19A and 19B. In some embodiments of the present disclosure, the reticle stage 19 is charged by a voltage between about 1.1 kV to about 2 kV.

Figure 20A:
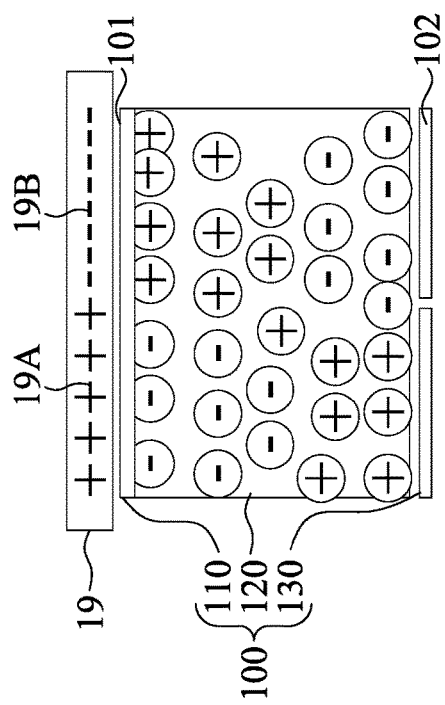
FIG. 20A shows a side view of a cleaning mask held onto a reticle stage according to some embodiments of the present disclosure
Figure 20B:
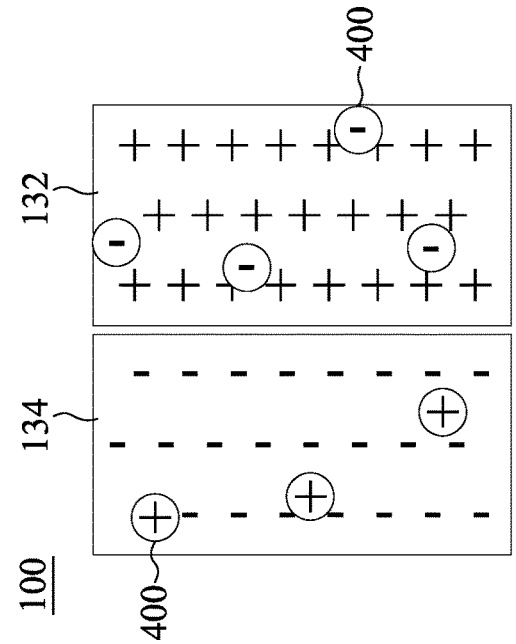
FIG. 20B shows a top view of the cleaning mask in FIG. 20A.

FIG. 20A shows the cleaning mask 100 held onto the reticle stage 19 according to some embodiments of the present disclosure, and FIG. 20B shows a top view of the cleaning mask 100 in FIG. 20A. In some other embodiments of the present disclosure, the first stage portion 19a of the reticle stage 19 is negatively charged, and the second stage portion 19B of the reticle stage 19 is positively charged. As such, the first portion 132 of the third layer 130 of the cleaning mask 100 is negatively charged and the second portion 134 is positively charged as shown in FIGS. 20A and 20B. In some embodiments of the present disclosure, the reticle stage 19 is charged by a voltage between about 1.1 kV to about 2 kV.

Charged particles 400 are attracted toward the second face 102 of the cleaning mask 100. Specifically, particles 400 having charges opposite to the charge induced on the second face 102 of the cleaning mask 100 are attracted toward the second face 102 of the cleaning mask 100. If the second face 102 of the cleaning mask 100 is negatively charged, positively charged particles 400 are attracted toward the second face 102 of the cleaning mask 100. If the second face 102 of the cleaning mask 100 is positively charged, negatively charged particles 400 are attracted toward the second face 102 of the cleaning mask 100.

In some embodiments, charged particles 400 are repelled away from the second face 102 of the cleaning mask 100. Specifically, particles 400 having charges similar to the charge induced on the second face 102 of the cleaning mask 100 are repelled from the second face 102 of the cleaning mask 100. If the second face 102 of the cleaning mask 100 is negatively charged, positively charged particles 400 are repelled from the second face 102 of the cleaning mask 100. If the second face 102 of the cleaning mask 100 is positively charged, negatively charged particles 400 are repelled from the second face 102 of the cleaning mask 100. In some embodiments of the present disclosure, the cleaning mask 100 and the reticle stage 19 are inside the enclosure 14, and the charged particles 400 attracted toward the second face 102 of the cleaning mask 100 are contaminants inside the enclosure 14.

Figure 14:
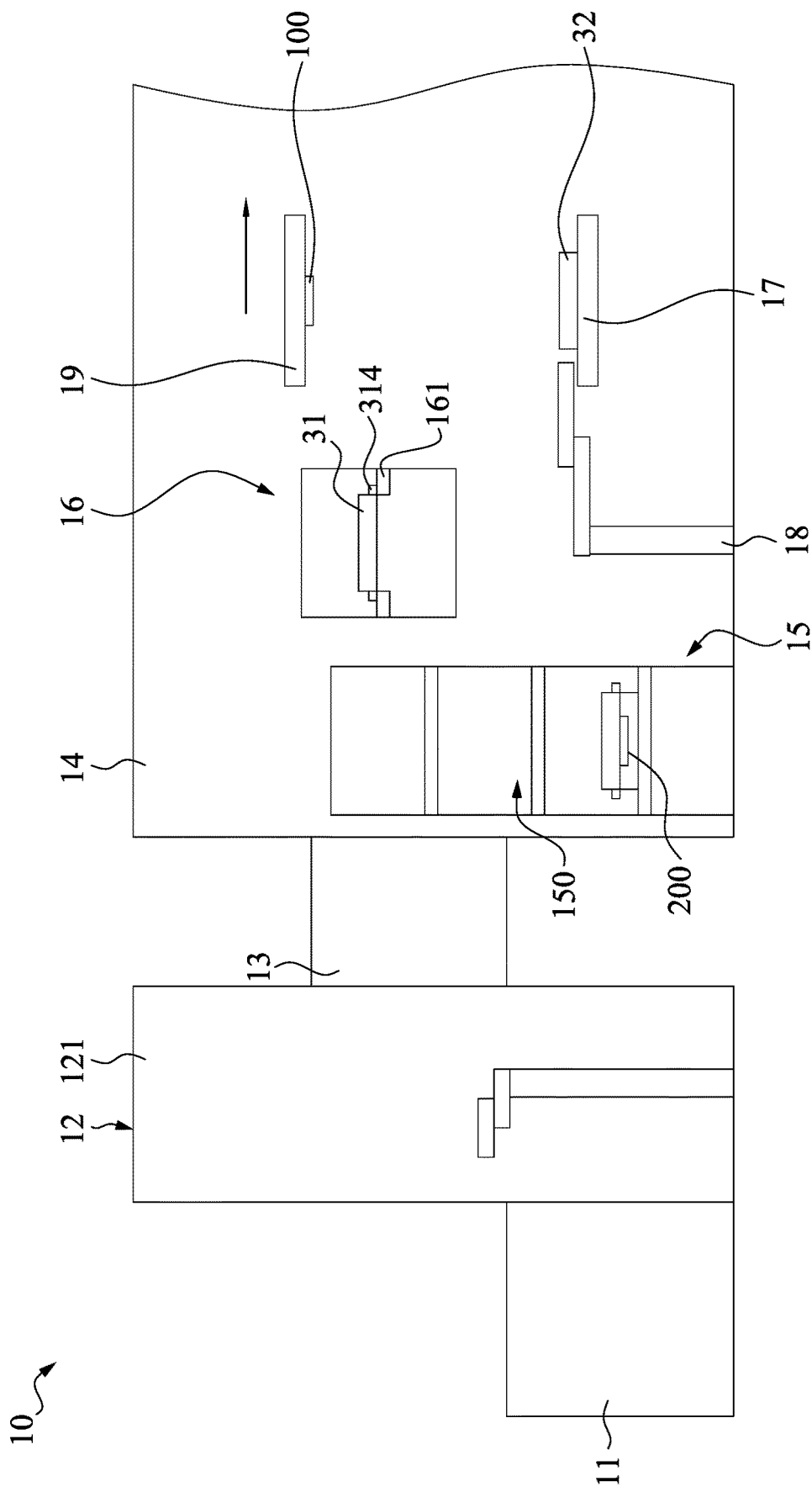
Figure 15:
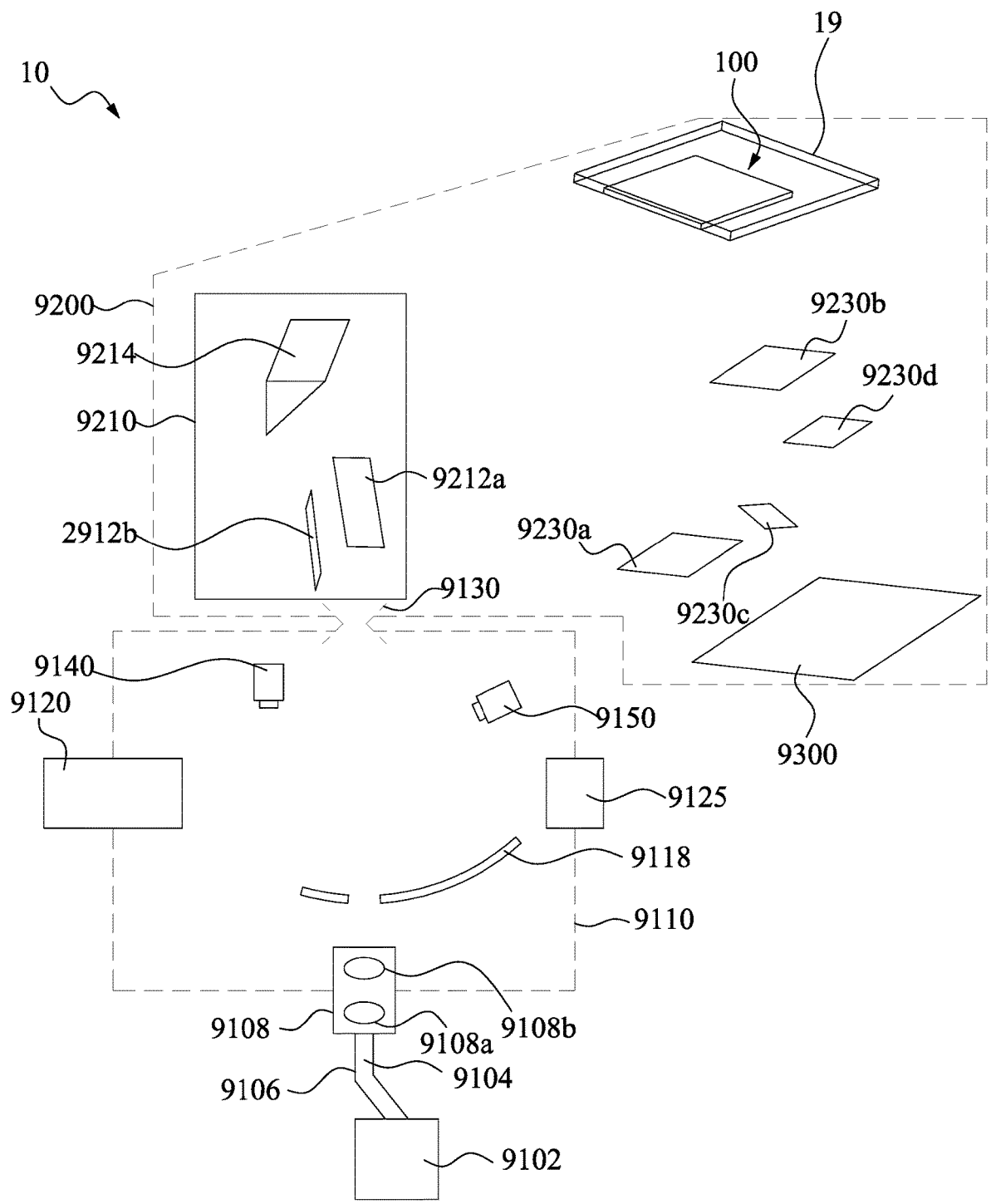
FIG. 15 shows a schematic view of another portion of the lithography exposure apparatus, according to some embodiments of the present disclosure.

In operation 51100, the cleaning mask is moved to the exposure position. For example, as shown in FIGS. 14 and 15, the cleaning mask 100 is moved by the reticle stage 19 such that the cleaning mask 100 is accurately positioned for the next operation. In some embodiments, the cleaning mask 100 is moved with a second speed lower than the first speed mentioned in operation S1040 and FIG. 9. The cleaning mask 100 is moved at a slower speed to increase time of attraction between the cleaning mask 100 and particles 400 inside the enclosure 14.

In FIG. 15, when the cleaning mask 100 is moved to the exposure position, the exposure process is not performed. That is, the laser source 9102 is turned off, and/or the fuel droplet generator 9120 does not provide fuel droplets when the cleaning mask 100 is at the exposure position. In some embodiments, there is no wafer on the wafer stage 9300 as shown in FIG. 15.

Figure 16:
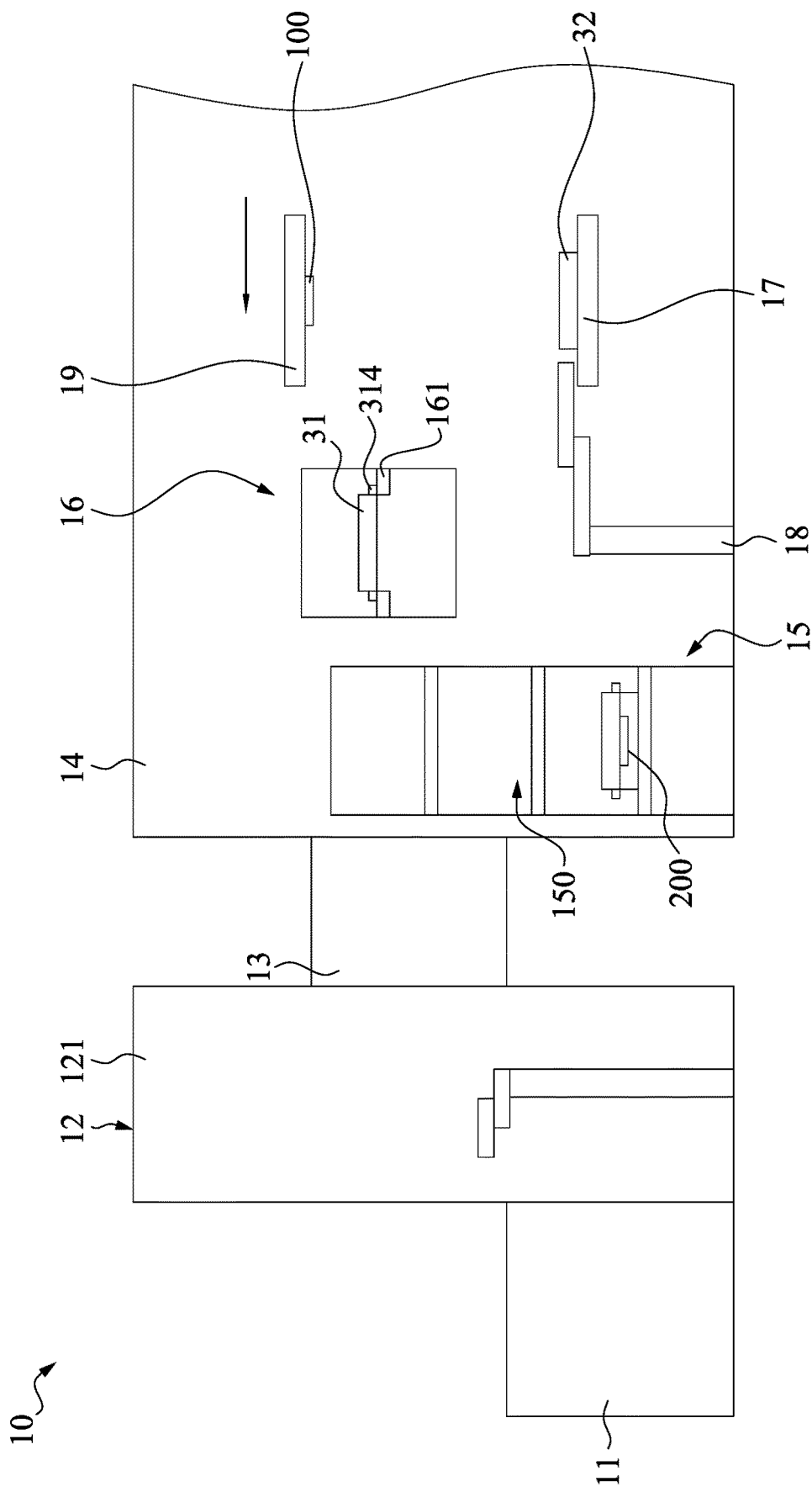
FIGS. 16-18 show a schematic diagram of a portion of a lithography exposure apparatus, according to some embodiments of the present disclosure.
Figure 17:
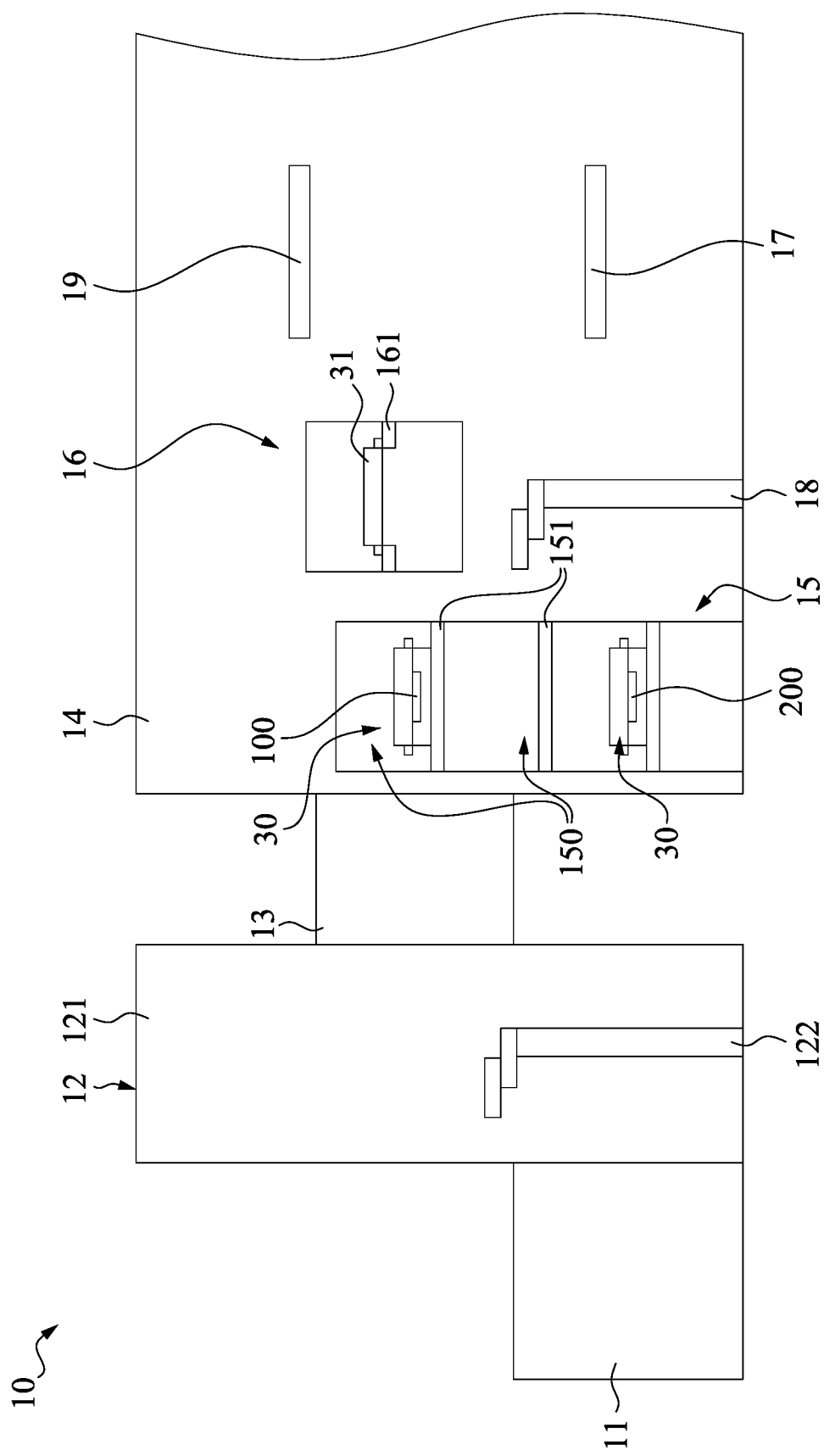

In operation S1110 of FIG. 3, the cleaning mask is removed from the reticle stage. Specifically, as shown in FIGS. 15 and 16, the reticle stage 19 moves the cleaning mask 100 back to the position above the reticle exchanging station 17. As shown in FIGS. 16 and 17, the reticle exchanging station 17 then moves upward, such that the baseplate 32 contacts the cleaning mask 100. The reticle stage 19 then halts clamping the cleaning mask 100, such that the cleaning mask 100 is back to the baseplate 32. The cleaning mask 100 and the baseplate 32 are then back to the upper lid handling chamber 16, and the upper lid 31 covers the cleaning mask 100 and the baseplate 32, such that the cleaning mask 100 is stored in its carrier 30. The cleaning mask 100 and its carrier 30 are then back to the reticle library 15, as shown in FIG. 17. In some embodiments, the operations S1080 to operation S1110 are referred to as an operation S110 ((first) cleaning mask operation).

Figure 18:
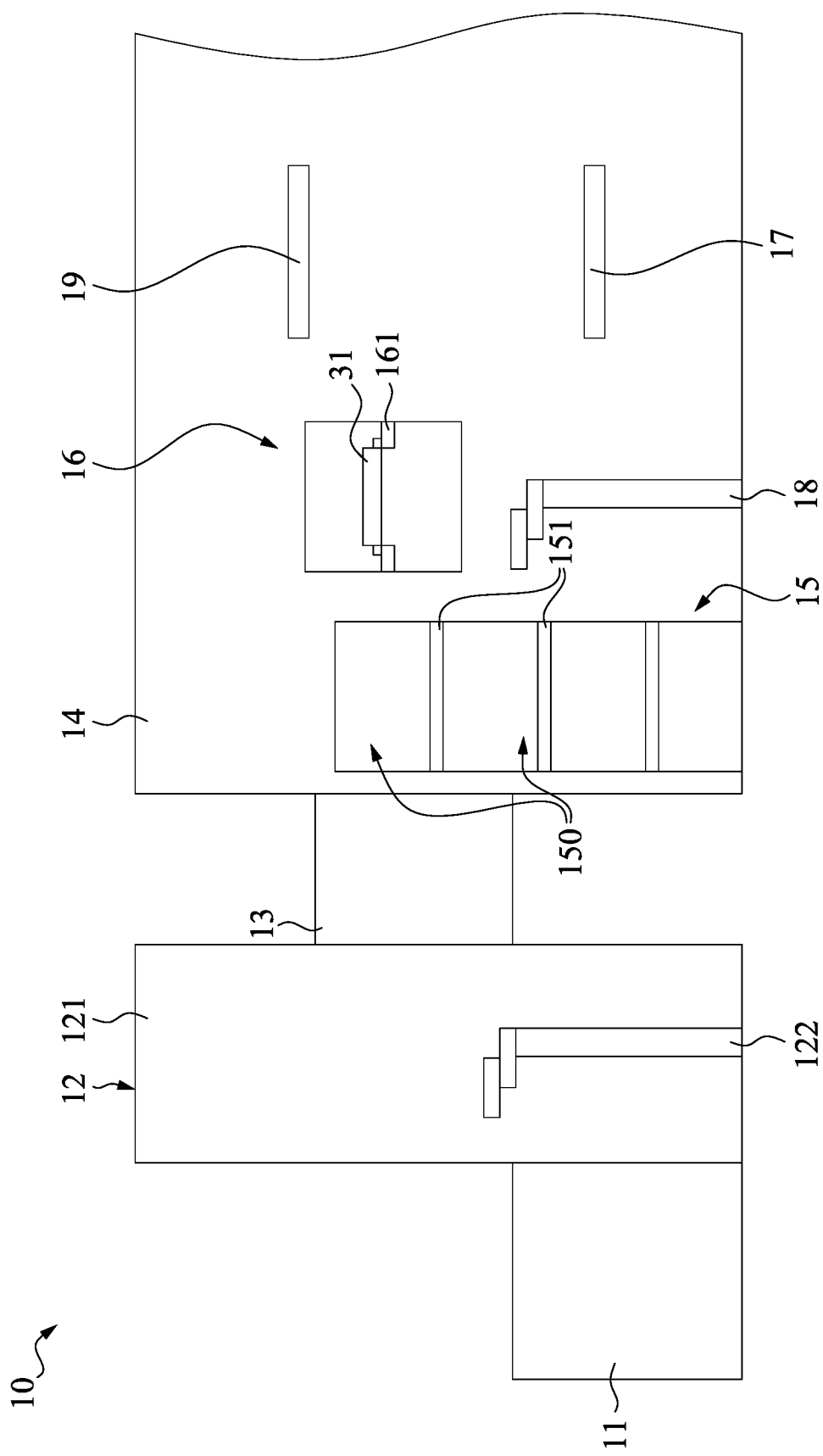

In some embodiments, the enclosure 14 is further cleaned after exposure processes. In operation S1120 of FIG. 3, the cleaning mask and the photomask are removed from the enclosure. As shown in FIGS. 17 and 18, the carriers 30 respectively containing the cleaning mask 100 and the photomask 200 pass through the load lock chamber 13, and the robotic arm 122 transports the carriers 300 from the load lock chamber 13 to the transport pod 20 (see FIG. 1). A portion of the contaminants attracted by the cleaning mask 100 is removed with the cleaning mask 100 from the enclosure 14.

In operation 51130 of FIG. 3, the vacuum in the enclosure is broken after removing the cleaning mask and the photomask from the enclosure. In operation S1140 of FIG. 3, airflow is introduced into the enclosure, and in operation S1150 of FIG. 3, air is evacuated out of the enclosure. As such, the rest of the contaminants in the enclosure 14 can be evacuated out of the enclosure 14. Due to the cleaning mask 100, most of the contaminants can be removed from the enclosure 14 without breaking vacuum. As such, the production yield of the lithography exposure apparatus 10 can be increased.

Figure 21:
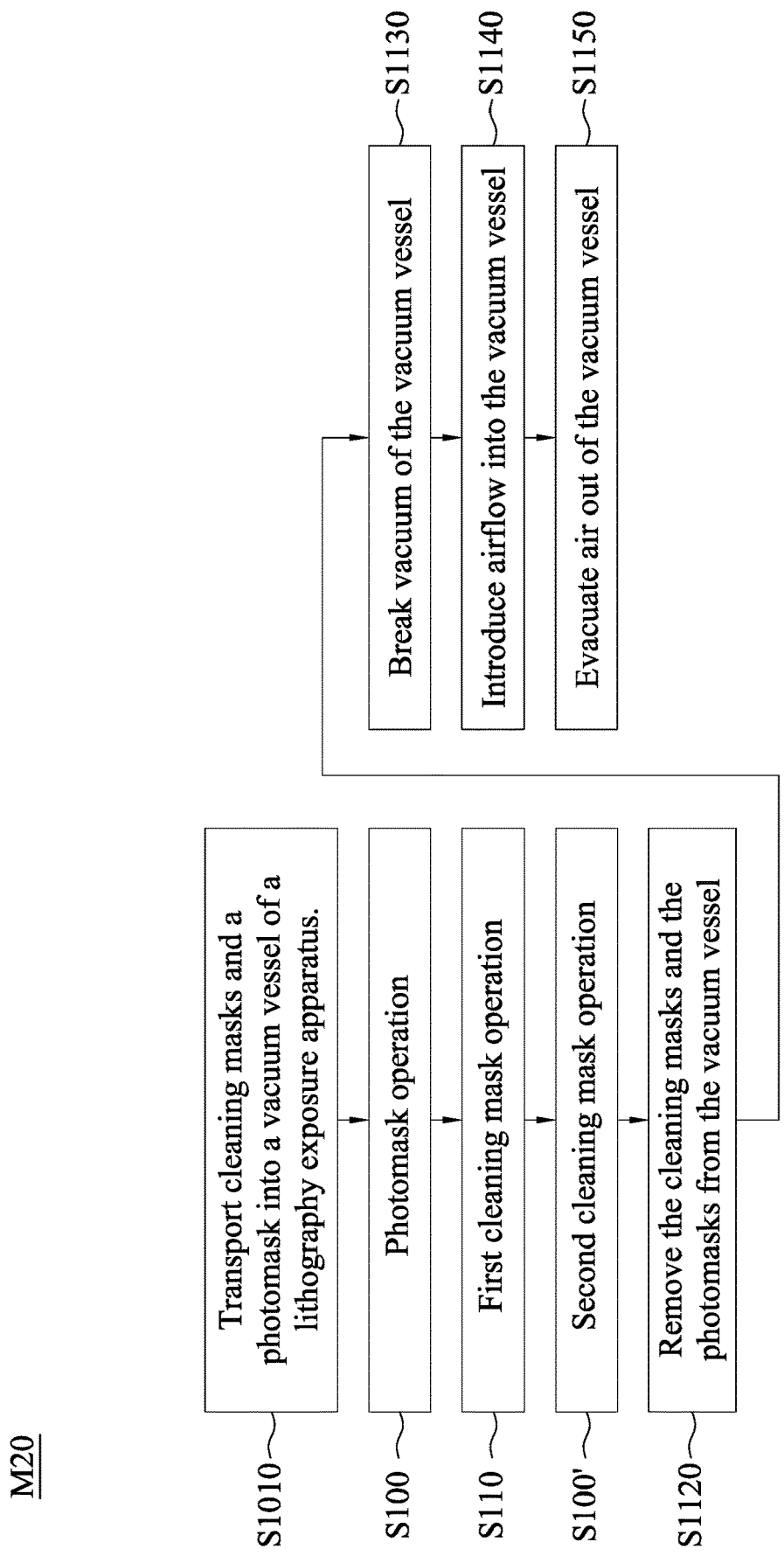
FIG. 21 shows a flowchart of another method according to some embodiments of the present disclosure.

FIG. 21 shows a flowchart of a method M20 according to some embodiments of the present disclosure. The difference between the method M20 in FIG. 21 and the method M10 in FIG. 3 pertains to the operation S100' between the operation S110 and the operation 1120. In FIG. 21, the operation S100' is similar to or substantially the same as the operation S100. For example, the operation S100' includes the operations S1020-S1070 in FIG. 3, but the photomasks in operations S100' and S100 are different reticles. Other relevant operation details of the method M20 are substantially the same as or similar to the method M10 in FIG. 3, and, therefore, a description in this regard will not be repeated hereinafter.

Figure 22:
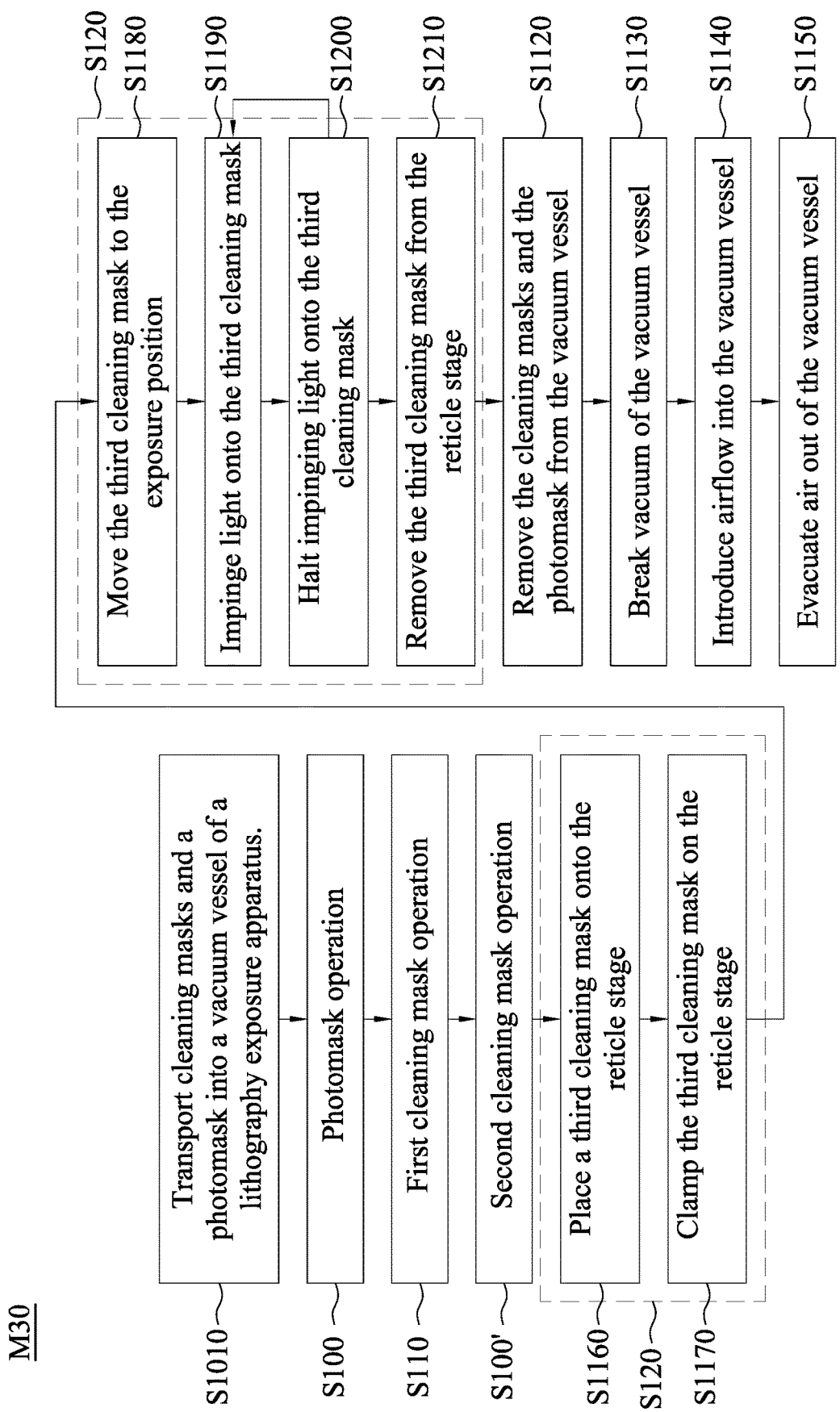
FIG. 22 shows a flowchart of another method according to some embodiments of the present disclosure.

FIG. 22 shows a flowchart of a method M30 according to some embodiments of the present disclosure. Since the processes in operations S1010, S100, S110, and S1120-S1150 are substantially the same as in the method M10 of FIG. 3, a detailed description is not repeated herein. In FIG. 22, an operation S110' is performed after the operation S110. The operation S110' is similar to or substantially the same as the operation S110. For example, the operation S110 uses a first cleaning mask which is charged as shown in FIGS. 19A and 19B, and the operation S120 uses a second cleaning mask which is charged as shown in FIGS. 20A and 20B.

Figure 23:
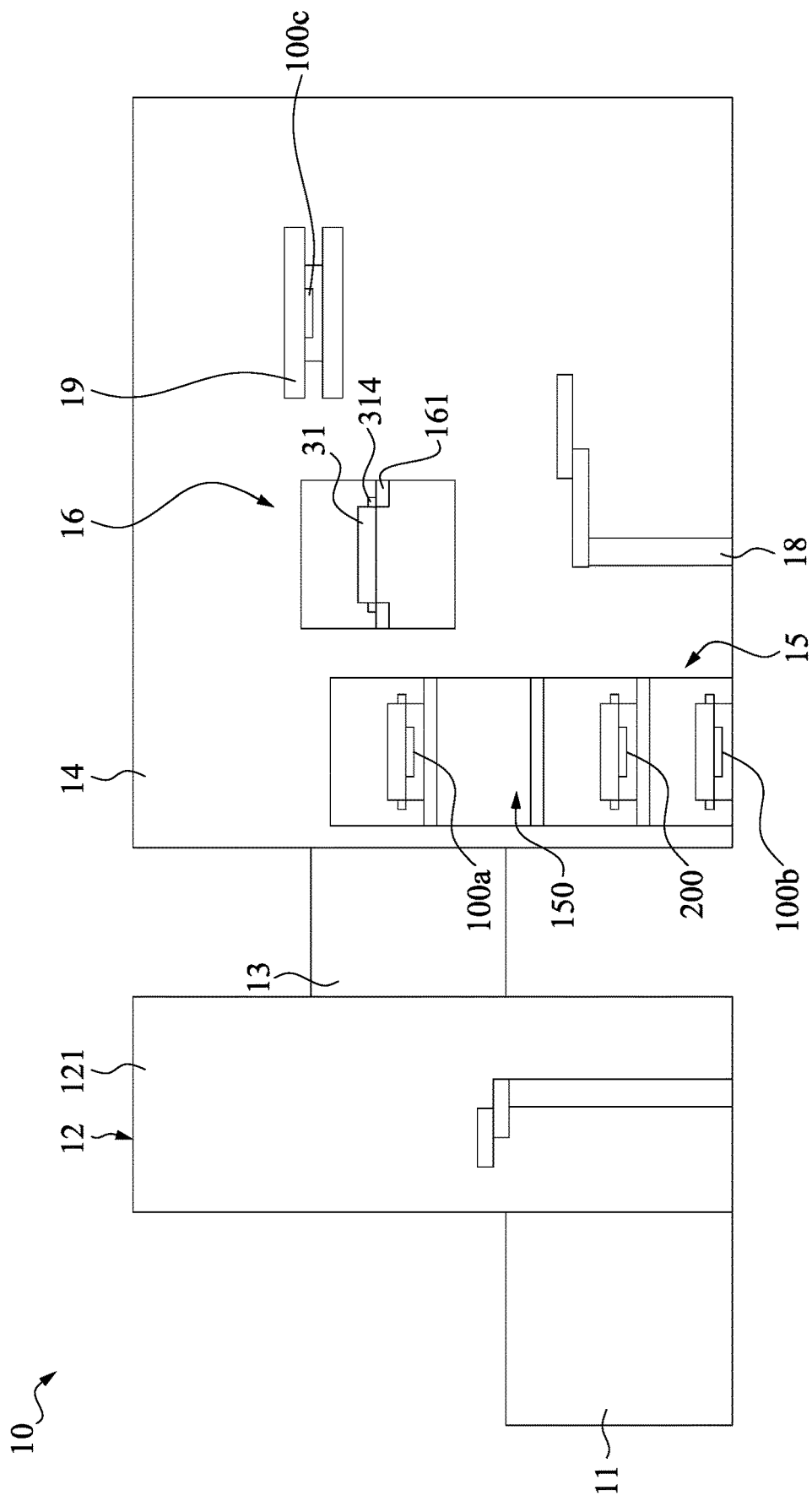
FIGS. 23-24 show a schematic diagram of a portion of a lithography exposure apparatus, according to some embodiments of the present disclosure.

The method M100 continues with operation S1160 of FIG. 22, a third cleaning mask is placed onto the reticle stage. The flow chart of operation S1160-S1200 will be described along with the drawings shown in FIGS. 23-27. Specifically, after the operation S100, the photomask 200 is put in the reticle library 15; after the operation S110, the first cleaning mask 100a is put in the reticle library 15; and after the operation S110', the second cleaning mask 100b is put in the reticle library 15. In operation S1160, the third cleaning mask 100c is transported to the reticle stage 19 from the reticle library 15, as shown in FIG. 23.

Figure 24:
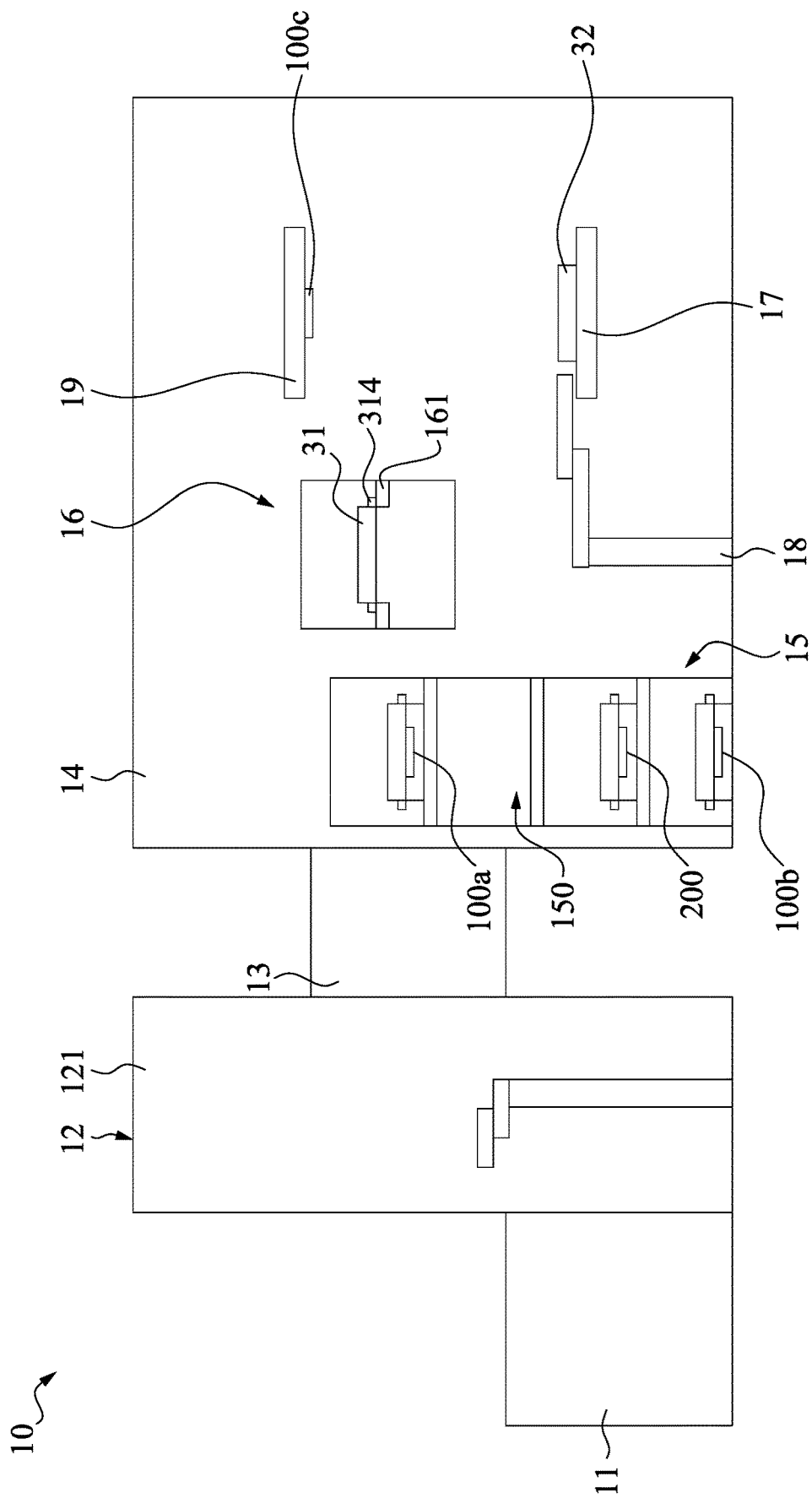

In operation S1170 of FIG. 22, the third cleaning mask is clamped on the reticle stage. For example, in FIG. 24, the E-chuck of the reticle stage 19 creates a clamping force by generating an electrostatic field, and the third cleaning mask 100c is secured by the reticle stage 19 with the clamping force generated by the reticle stage 19. After the third cleaning mask 100c is secured by the reticle stage 19, the vacant baseplate 32 is lowered down to its original position. In FIG. 24, after the reticle stage 19 clamps the third cleaning mask 100c, the third cleaning mask 100c has a charging distribution as shown in FIGS. 19A-19B or FIGS. 20A-20B.

Figure 25:
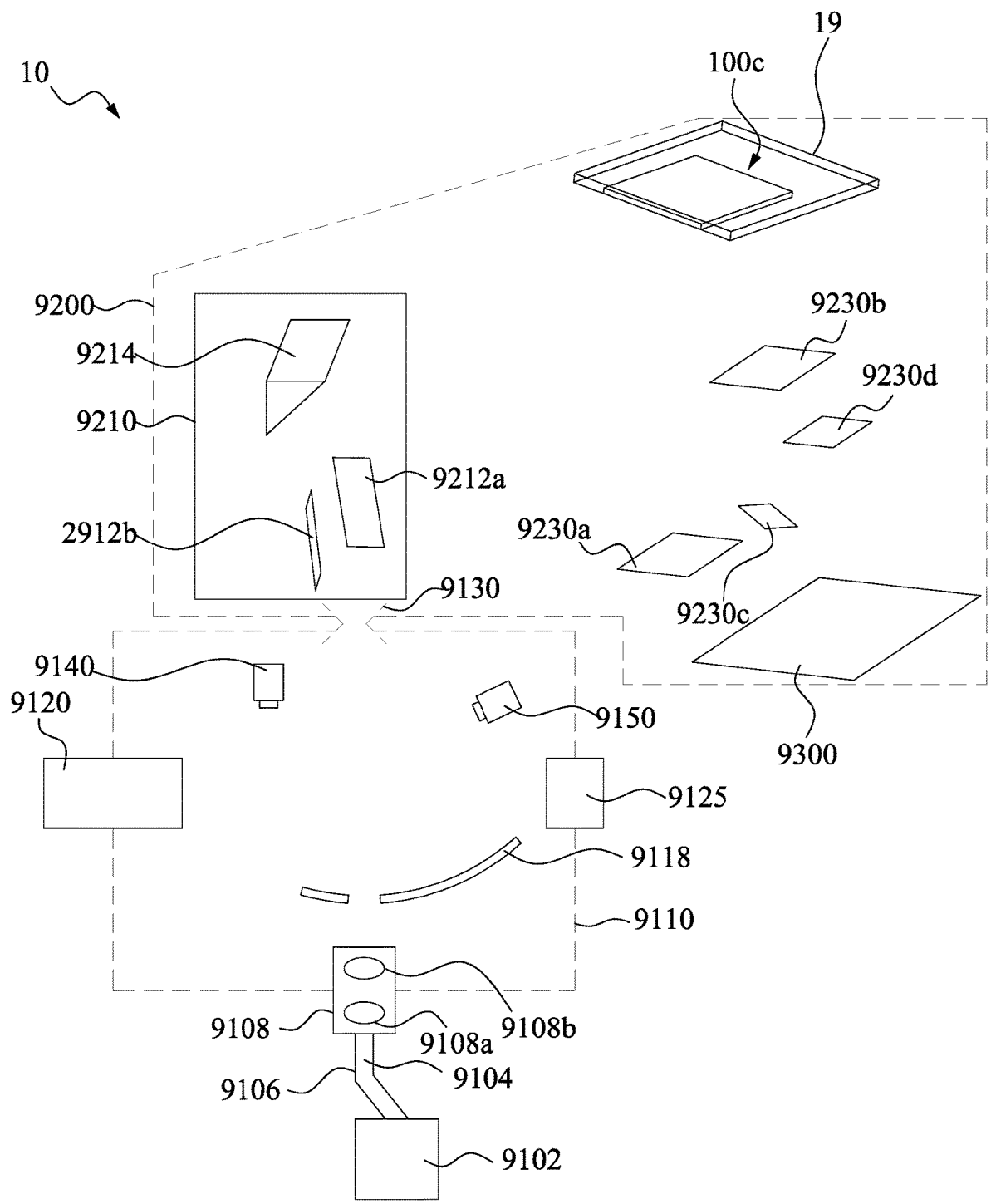
FIGS. 25-27 show a schematic view of another portion of the lithography exposure apparatus, according to some embodiments of the present disclosure.

In operation S1180 of FIG. 22, the third cleaning mask is moved to the exposure position. For example, as shown in FIGS. 24 and 25, the third cleaning mask 100c is moved by the reticle stage 19 such that the third cleaning mask 100c is accurately positioned for the next operation. In some embodiments, the third cleaning mask 100c is moved with a second speed lower than the first speed mentioned in operation S1040 and FIG. 9. The third cleaning mask 100c is moved at a slower speed to increase time of attraction between the third cleaning mask 100c and particles 400 inside the enclosure 14.

Figure 26:
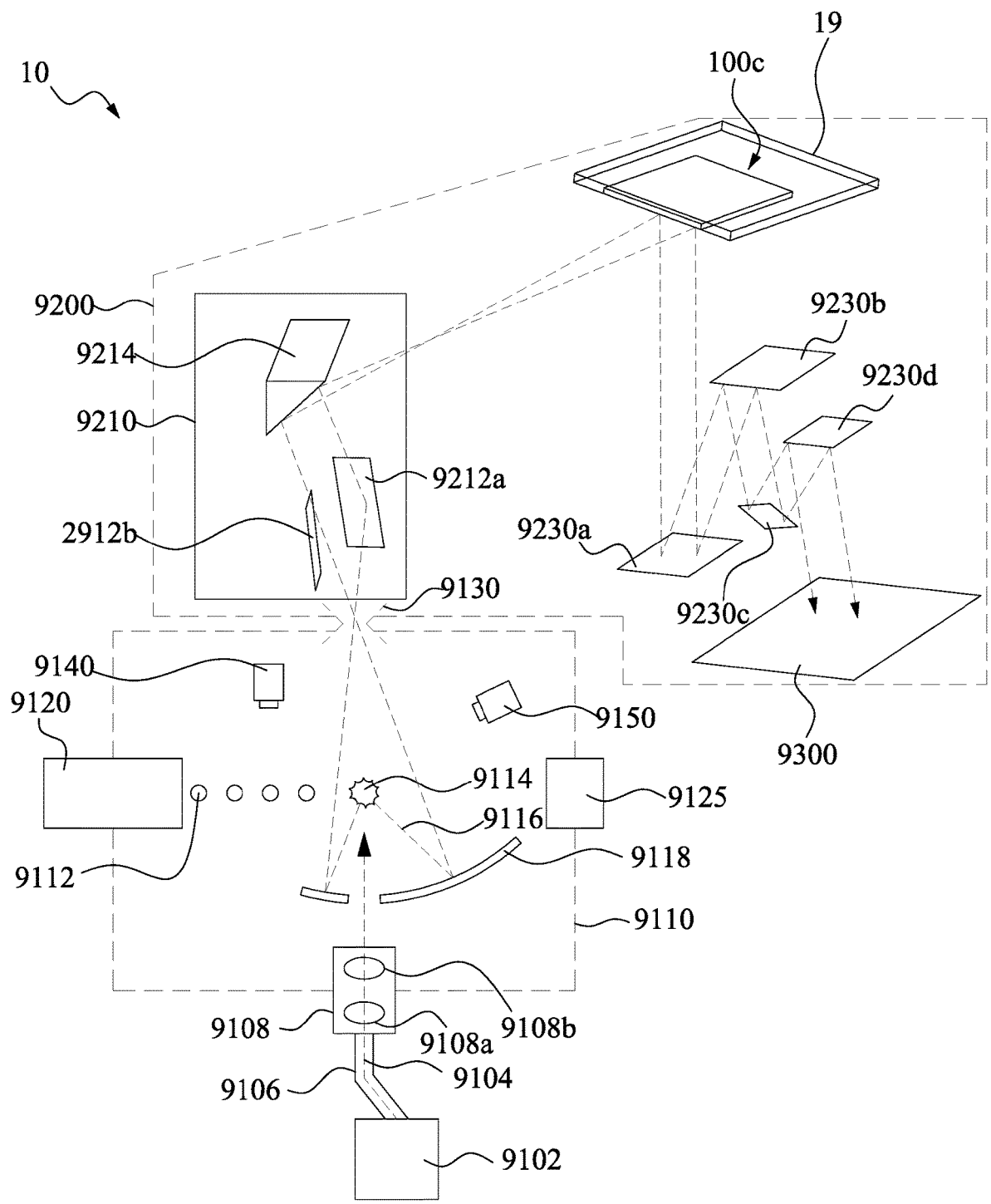

In operation S1190 of FIG. 22, light is impinged onto the third cleaning mask. For example, as shown in FIG. 26, the laser source 9102 is turned on, and the fuel droplet generator 9120 provides fuel droplets 9112 when the third cleaning mask 100c is at the exposure position. As such, EUV radiation 9116 is incident on the third cleaning mask 100e. In some embodiments, there is no wafer on the wafer stage 9300 as shown in FIG. 26.

Figure 28:
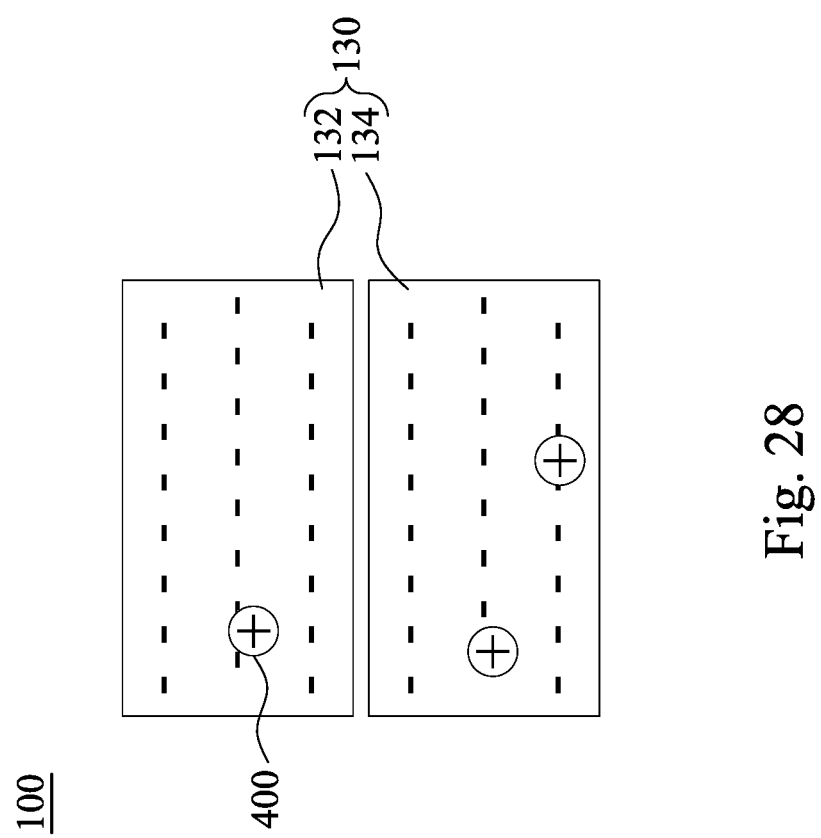
FIG. 28 shows a top view of a cleaning mask according to some embodiments of the present disclosure.

During this operation, since some of the ions of the plasma 9114 are also impinged onto the third cleaning mask 100c, the whole third layer 130 of the third cleaning mask 100c is negatively charged, as shown in FIG. 28. As such, positively charged particles 400 can be attracted to the third cleaning mask 100c.

Figure 27:
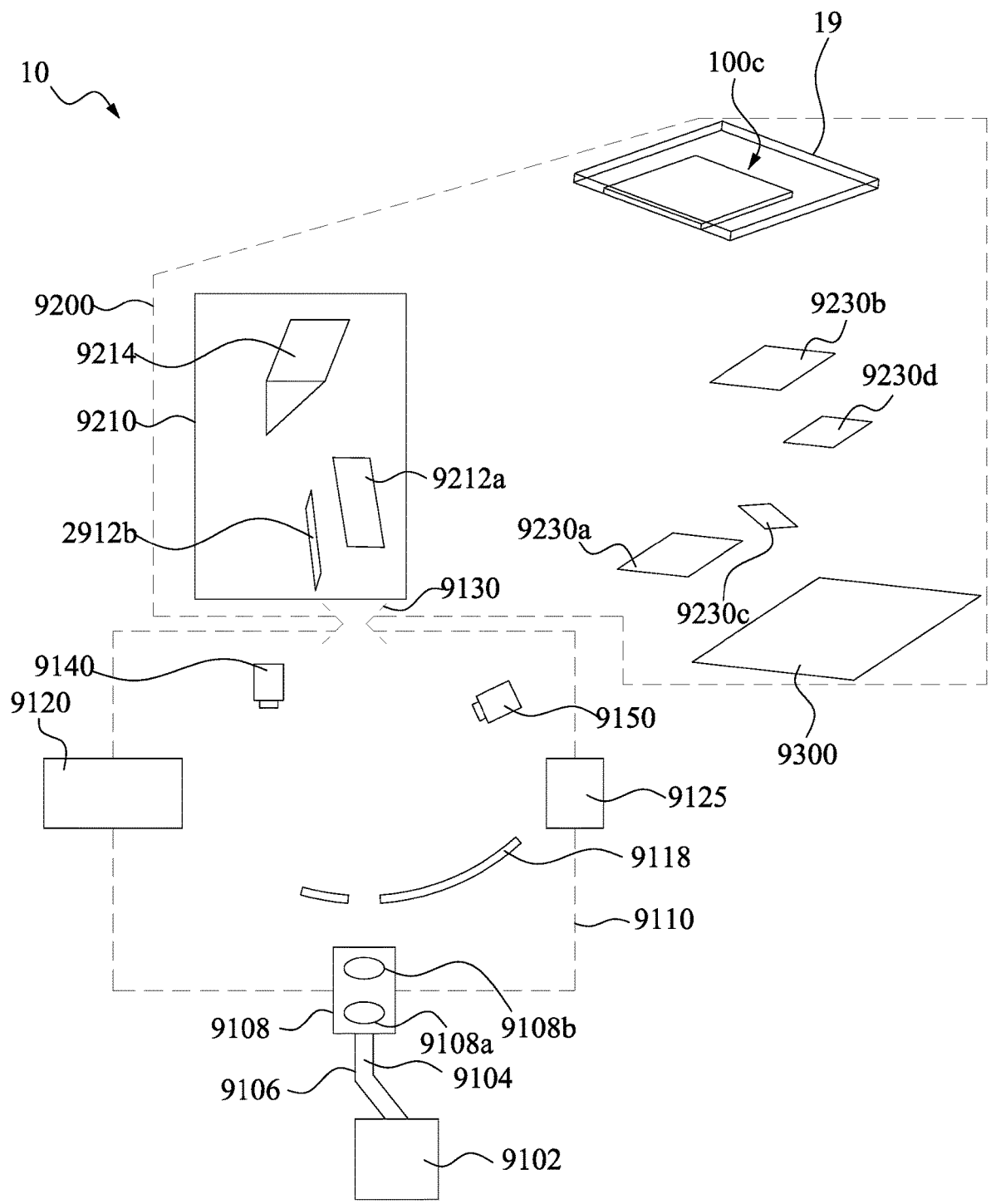

In operation S1200 of FIG. 22, halting impinging light onto the third cleaning mask. For example, as shown in FIG. 27, the laser source 9102 is turned off, and the fuel droplet generator 9120 does not provide fuel droplets. As such, there is no EUV radiation incident on the third cleaning mask 100c. In some embodiments, the operations S1190 and 1200 can be repeatedly performed many times, such that the light is a pulsed light.

In operation S1210 of FIG. 22, the third cleaning mask is removed from the reticle stage. The operation S1210 of FIG. 22 is similar to the operation S1110 of FIG. 3, and, therefore, a description regarding the operation S1210 is not repeated herein. In some embodiments, the operations S1160 to operation S1210 are referred to as an operation S130 (a third cleaning mask operation). The method M30 then undergoes the operations S1120-S1150.

Figure 29:
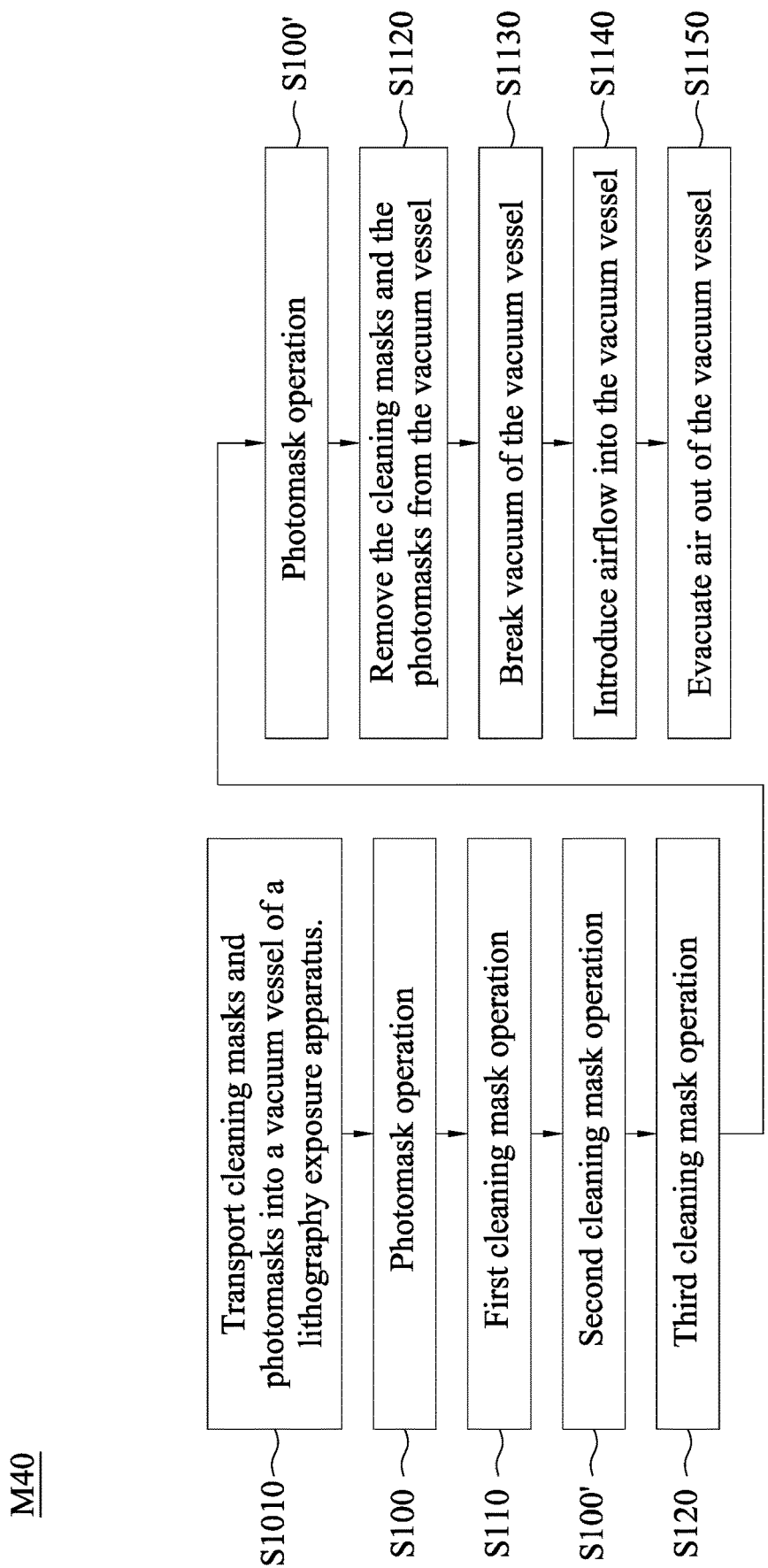
FIG. 29 shows a flowchart of another method according to some embodiments of the present disclosure.

FIG. 29 shows a flowchart of a method M40 according to some embodiments of the present disclosure. The difference between the method M40 in FIG. 29 and the method M30 in FIG. 22 pertains to the operation S100' between the operation S120 and the operation 1120. In FIG. 29, the operation S100' is similar to or substantially the same as the operation S100. For example, the operation S100' includes the operations S1020-S1070 in FIG. 3, but the photomasks in operations S100' and S100 are different reticles. Other relevant operation details of the method M40 are substantially the same as or similar to the method M30 in FIG. 22, and, therefore, a description in this regard will not be repeated hereinafter.

Figure 30:
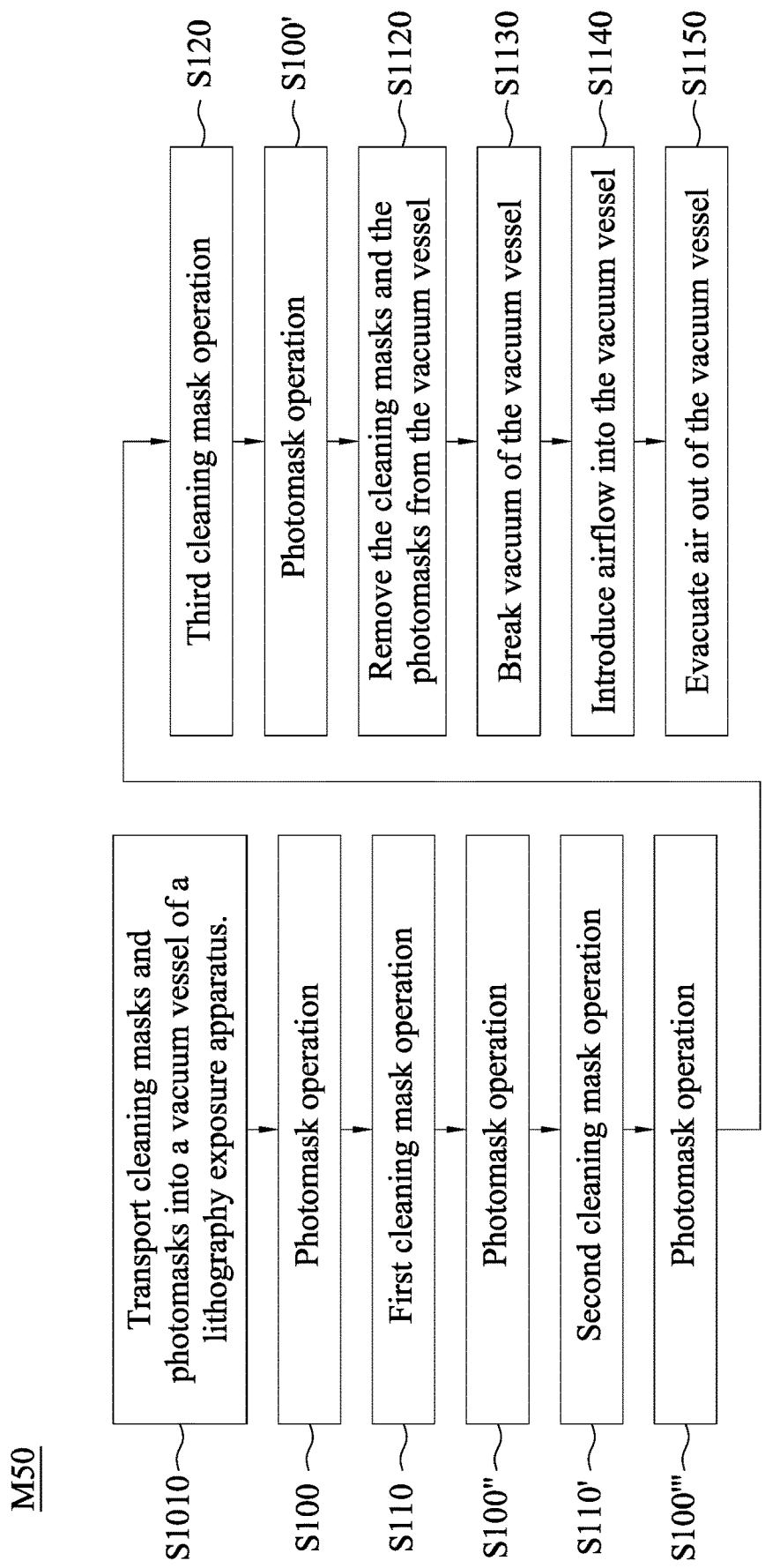
FIG. 30 shows a flowchart of another method according to some embodiments of the present disclosure.

FIG. 30 shows a flowchart of a method M50 according to some embodiments of the present disclosure. The difference between the method M50 in FIG. 30 and the method M40 in FIG. 29 pertains to the operations S100" and S100'''. In FIG. 30, the operations S100" and S100''' are similar to or substantially the same as the operation S100. For example, the operations S100" and S100''' each includes the operations S1020-S1070 in FIG. 3, but the photomasks in operations S100", S100''', and S100 are different reticles. Other relevant operation details of the method M50 are substantially the same as or similar to the method M40 in FIG. 29, and, therefore, a description in this regard will not be repeated hereinafter.

According to some embodiments of the present disclosure, a method includes transporting a cleaning mask and a photomask into an enclosure of a lithography exposure apparatus, wherein the photomask includes a multilayered mirror structure, and the cleaning mask is free of the multilayered mirror structure; placing the cleaning mask on a reticle stage of the lithography exposure apparatus; and charging the cleaning mask to attract charged particles in the enclosure.

According to some embodiments of the present disclosure, a method includes placing a first cleaning mask on a reticle stage of a lithography exposure apparatus, wherein the first cleaning mask includes a top layer facing away from the reticle stage; turning off a light source of the lithography exposure apparatus; after turning off the light source, charging the first cleaning mask such that a first portion of the top layer includes negative charges and a second portion of the top layer includes positive charges; halting charging the first cleaning mask; and removing the first cleaning mask from the reticle stage.

According to some embodiments of the present disclosure, a mask has a first layer, a second layer over the first layer, and a top layer over the second layer. The first layer is made of a tantalum compound, the second layer is made of a conductive material, and the top layer is made of a tantalum compound. The second layer is in contact with the first layer and the top layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   transporting a first cleaning mask and a photomask into an enclosure of a lithography exposure apparatus, wherein the photomask comprises a multilayered mirror structure, and the first cleaning mask is free of the multilayered mirror structure;
   placing the photomask onto a reticle stage of the lithography exposure apparatus;
   moving the photomask with a first speed by using the reticle stage;
   performing an exposure process with the photomask;
   removing the photomask from the reticle stage;
   after removing the photomask, placing the first cleaning mask on the reticle stage;
   moving the first cleaning mask with a second speed by using the reticle stage, wherein the second speed is slower than the first speed; and
   charging the first cleaning mask to attract charged particles in the enclosure.

2. The method of claim 1, wherein the first cleaning mask comprises:
   a base;
   a conductive layer over the base; and
   a top layer over the conductive layer.

3. The method of claim 2, wherein the top layer has a first area in a top view, and the conductive layer has a second area in the top view, and a ratio of the first area to the second area is in a range of about 0.80 to about 1.

4. The method of claim 1, further comprising:
removing the first cleaning mask from the reticle stage.

5. The method of claim 4, further comprising:
breaking vacuum after removing the first cleaning mask from the reticle stage.

6. The method of claim 1, further comprising:
removing the first cleaning mask and the photomask out of the enclosure; and
introducing airflow into the enclosure after removing the first cleaning mask and the photomask out of the enclosure; and
evacuating air out of the enclosure.

7. The method of claim 1, further comprising:
removing the first cleaning mask from the reticle stage; and
after removing the first cleaning mask, placing a second cleaning mask on the reticle stage, wherein the second cleaning mask is free of a multilayered mirror structure.

8. The method of claim 7, further comprising:
charging the second cleaning mask by using the reticle stage.

9. The method of claim 8, further comprising:
after charging the second cleaning mask, directing a radiation to the second cleaning mask.

10. A method, comprising:
placing a first cleaning mask on a reticle stage of a lithography exposure apparatus, wherein the first cleaning mask comprises a top layer facing away from the reticle stage;
turning off a light source of the lithography exposure apparatus;
after turning off the light source, charging the first cleaning mask such that a first portion of the top layer comprises negative charges and a second portion of the top layer comprises positive charges;
halting charging the first cleaning mask;
removing the first cleaning mask from the reticle stage;
after removing the first cleaning mask, placing a second cleaning mask on the reticle stage, wherein the second cleaning mask is free of a multilayered mirror structure;
charging the second cleaning mask, using the reticle stage, to attract charged particles in an enclosure of the lithography exposure apparatus; and
after charging the second cleaning mask, turning on the light source to provide light onto a top surface of the second cleaning mask.

11. The method of claim 10, further comprising:
turning on the light source after removing the first cleaning mask from the reticle stage.

12. The method of claim 10, wherein the light is a pulsed light.

13. The method of claim 10, wherein a wafer stage of the lithography exposure apparatus is free of a wafer disposed thereon when the light is incident on the top surface of the second cleaning mask.

14. The method of claim 10, further comprising:
placing a photomask on the reticle stage after removing the first cleaning mask from the reticle stage and prior to placing the second cleaning mask on the reticle stage; and
performing an exposure process by using the photomask.

15. The method of claim 10, further comprising:
removing the second cleaning mask from the reticle stage;
placing a photomask on the reticle stage after removing the second cleaning mask from the reticle stage; and
performing an exposure process by using the photomask.

16. The method of claim 10, further comprising:
after turning on the light source to provide light onto a top surface of the second cleaning mask, turning off the light source; and
removing the second cleaning mask from the reticle stage.

17. The method of claim 16, further comprising:
breaking vacuum after removing the second cleaning mask.

18. A method, comprising:
placing a first cleaning mask on a reticle stage of a lithography exposure apparatus, the first cleaning mask being free of a multilayered mirror structure and comprising a tantalum-containing layer and a conductive layer between the reticle stage and the tantalum-containing layer;
charging the first cleaning mask to attract charged particles in an enclosure of the lithography exposure apparatus;
after charging the first cleaning mask, removing the first cleaning mask from the reticle stage;
after removing the first cleaning mask, placing a first photomask on the reticle stage;
performing a first exposure process by using the first photomask;
after performing the first exposure process, removing the first photomask from the reticle stage;
after removing the first photomask, placing a second cleaning mask on the reticle stage;
charging the second cleaning mask;
after charging the second cleaning mask, removing the second cleaning mask from the reticle stage;
after removing the second cleaning mask, placing a third cleaning mask on the reticle stage;
charging the third cleaning mask; and
after charging the third cleaning mask, directing a radiation to the third cleaning mask.

19. The method of claim 18, further comprising:
after removing the second cleaning mask, placing a second photomask on the reticle stage; and
performing a second exposure process by using the second photomask.

20. The method of claim 18, wherein a wafer stage of the lithography exposure apparatus is free of a wafer disposed thereon when the radiation is incident on the third cleaning mask.

* * * * *